(12) United States Patent
Kiguchi et al.

(10) Patent No.: US 11,795,293 B2
(45) Date of Patent: Oct. 24, 2023

(54) EPOXY RESIN, EPOXY RESIN COMPOSITION, RESIN SHEET, B-STAGE SHEET, C-STAGE SHEET, CURED PRODUCT, METAL FOIL WITH RESIN, METAL SUBSTRATE, AND POWER SEMICONDUCTOR DEVICE

(71) Applicant: Hitachi Chemical Company, Ltd., Tokyo (JP)

(72) Inventors: Kazuya Kiguchi, Tokyo (JP); Tomoo Nishiyama, Tokyo (JP); Daisuke Fujimoto, Tokyo (JP); Norihiko Sakamoto, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 16/980,652

(22) PCT Filed: Mar. 15, 2018

(86) PCT No.: PCT/JP2018/010347
§ 371 (c)(1),
(2) Date: Sep. 14, 2020

(87) PCT Pub. No.: WO2019/176074
PCT Pub. Date: Sep. 19, 2019

(65) Prior Publication Data
US 2021/0016546 A1    Jan. 21, 2021

(51) Int. Cl.
*B32B 15/092*    (2006.01)
*C08K 3/013*    (2018.01)
*C08K 3/34*    (2006.01)
*H01L 23/36*    (2006.01)

(52) U.S. Cl.
CPC ............ *C08K 3/013* (2018.01); *B32B 15/092* (2013.01); *C08K 3/34* (2013.01); *H01L 23/36* (2013.01)

(58) Field of Classification Search
CPC ........ B32B 15/092; C08K 3/013; C08K 3/34; C08K 3/00; H01L 23/36; H01L 2224/32; C08G 59/306; C08G 59/3281; C08G 59/066; C08G 59/20; C08J 5/18; C08J 5/24; C08L 63/00
See application file for complete search history.

(56) References Cited

U.S. PATENT DOCUMENTS

| | | | |
|---|---|---|---|
| 5,811,504 A | 9/1998 | Shiota et al. | |
| 2007/0116938 A1* | 5/2007 | Tobita | B32B 27/38 |
| | | | 428/292.1 |
| 2011/0048261 A1* | 3/2011 | Shimura | C08L 83/04 |
| | | | 101/395 |
| 2012/0251830 A1* | 10/2012 | Nishiyama | C08L 61/12 |
| | | | 428/418 |
| 2013/0172459 A1* | 7/2013 | Tsuchikawa | C08G 73/0655 |
| | | | 524/188 |
| 2014/0213751 A1* | 7/2014 | Fukuzaki | C08G 59/621 |
| | | | 528/89 |
| 2015/0290887 A1* | 10/2015 | Swier | B29D 11/00451 |
| | | | 428/447 |
| 2015/0378216 A1* | 12/2015 | Oh | G02F 1/133603 |
| | | | 349/69 |
| 2017/0081579 A1* | 3/2017 | Fujikawa | C09K 5/14 |
| 2017/0174970 A1* | 6/2017 | Clough | C08L 83/04 |
| 2018/0057658 A1* | 3/2018 | Qiu | B32B 27/08 |
| 2021/0054133 A1* | 2/2021 | Fukuda | C08J 5/00 |

FOREIGN PATENT DOCUMENTS

| | | | | |
|---|---|---|---|---|
| EP | 2256541 A1 | 12/2010 | | |
| JP | 4118691 B2 | 7/2008 | | |
| JP | 2008-214599 A | 9/2008 | | |
| JP | 4619770 B2 | 1/2011 | | |
| JP | 2011-084557 A | 4/2011 | | |
| JP | 2012138455 A * | 7/2012 | | |
| JP | 2015-048400 A | 3/2015 | | |
| JP | 2015048400 A * | 3/2015 | | |
| KR | 10-2013-0095730 A | 8/2013 | | |
| TW | 201333064 A * | 8/2013 | ........... B32B 15/043 | |
| WO | 2012/018126 A1 | 2/2012 | | |

OTHER PUBLICATIONS

Machine Translation of JP 2008214599 A (Year: 2008).*
Machine translation of JP 2012/138455, https://patentscope.wipo.int/search/en/detail.jsf?docId=JP272765170&_cid=P10-L01B7L-37572-1 (Year: 2012).*
Machine Translation of JP 2015/048400, https://patentscope.wipo.int/search/en/detail.jsf?docId=JP273586324&_cid=P10-L00ZV0-57404-1 (Year: 2015).*
Machine Translation of TW 2013/33064 A (Year: 2013).*

\* cited by examiner

*Primary Examiner* — Callie E Shosho
*Assistant Examiner* — Bethany M Miller
(74) *Attorney, Agent, or Firm* — Fitch, Even, Tabin & Flannery, L.L.P.

(57) ABSTRACT

An epoxy resin has a mesogenic structure and a siloxane structure. An epoxy resin composition includes the epoxy resin having the mesogenic structure and the siloxane structure, and a curing agent.

14 Claims, 1 Drawing Sheet

EPOXY RESIN, EPOXY RESIN COMPOSITION, RESIN SHEET, B-STAGE SHEET, C-STAGE SHEET, CURED PRODUCT, METAL FOIL WITH RESIN, METAL SUBSTRATE, AND POWER SEMICONDUCTOR DEVICE

CROSS-REFERENCE TO RELATED APPLICATION

This application is a U.S. national phase application filed under 35 U.S.C. § 371 of International Application No. PCT/JP2018/010347, filed Mar. 15, 2018, designating the United States, the entire contents of which are hereby incorporated herein by reference.

TECHNICAL FIELD

The present invention relates to an epoxy resin, an epoxy resin composition, a B-stage sheet, a C-stage sheet, a cured product, a metal foil with resin, a metal substrate, and a power semiconductor device.

BACKGROUND ART

In recent years, along with miniaturization of electronic component devices, the amount of heat generated has increased, therefore it has become an important subject how to dissipate the heat. An example of an insulating material widely used for such devices includes a cured product of a thermosetting resin from the viewpoint of electric insulation, heat resistance or the like. However, in general, the heat conductivity of a cured product of a thermosetting resin is low, which is one of the major factors that prevent heat dissipation. Therefore, development of a cured product of a thermosetting resin having a high heat conductivity has been desired.

As the cured product of a thermosetting resin having a high heat conductivity, for example, a cured product of an epoxy resin composition having a mesogenic structure in the molecular structure has been proposed (see, for example, Patent Document 1 to Patent Document 3).

Furthermore, electronic component devices in recent years are becoming thinner. As a result, due to the difference in the coefficient of thermal expansion between the chip and the substrate, the electronic component device is liable to be warped. When an electronic component device is warped due to thermal stress, there may occur a trouble such as detachment of a cured product of a thermosetting resin from the electronic component device.

RELATED ART DOCUMENT

Patent Document

Patent Document 1: Japanese Patent No. 4118691
Patent Document 2: Japanese Patent No. 4619770
Patent Document 3: Japanese Patent Application Laid-Open (JP-A) No. 2011-84557

SUMMARY OF INVENTION

Technical Problem

When an electronic component device is warped due to a thermal stress, it is conceivable that decrease in the elasticity of a cured product is effective in suppressing detachment of the cured product of a thermosetting resin. In other words, an object of the present invention is to provide an epoxy resin which cured product is superior in heat conductivity, and capable of achieving a low elasticity, as well as an epoxy resin composition, an epoxy resin composition, a resin sheet, a B-stage sheet, a C-stage sheet, a cured product, a metal foil with resin, a metal substrate, and a power semiconductor device using the epoxy resin.

Solution to Problem

A specific means for solving the above-described problems includes the following embodiments.

<1> An epoxy resin having a mesogenic structure and a siloxane structure.

<2> The epoxy resin according to <1>, in which the mesogenic structure comprises a structure represented by the following Formula (1):

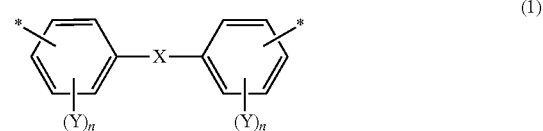

in which, in Formula (1), X represents a single bond or at least one kind of linking group selected from the following Group (I) consisting of divalent groups; each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group; each n independently represents an integer from 0 to 4; and * is a linking portion in a molecule;

Group (I) Consisting of Divalent Groups

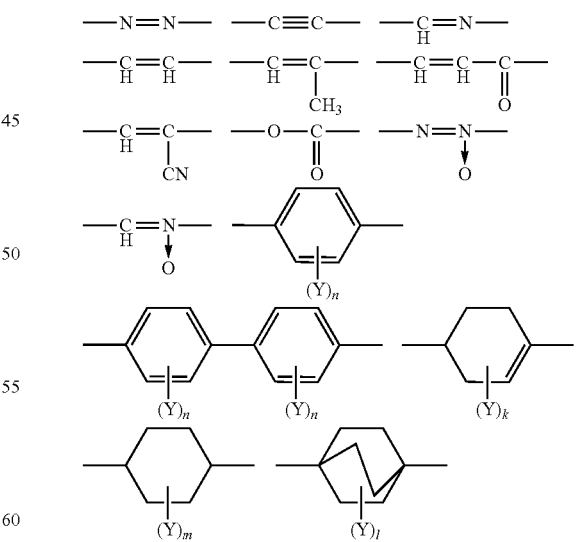

in which, in the Group (I) consisting of divalent groups, each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group; each n independently represents an integer from 0 to 4; k represents an integer from 0 to 7; m represents an integer from 0 to 8; and 1 represents an integer from 0 to 12.

<3> The epoxy resin according to <1> or <2>, in which the mesogenic structure comprises a structural unit derived from an epoxy compound having a mesogenic structure and an epoxy group.

<4> The epoxy resin according to <3>, in which the epoxy compound comprises two epoxy groups.

<5> The epoxy resin according to <3> or <4>, in which the epoxy compound comprises an epoxy compound represented by the following Formula (2):

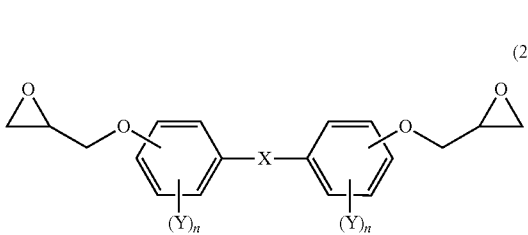

(2)

in which, in Formula (2), X represents a single bond or at least one kind of linking group selected from the following Group (I) consisting of divalent groups; each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group; and each n independently represents an integer from 0 to 4;

Group (I) Consisting of Divalent Groups

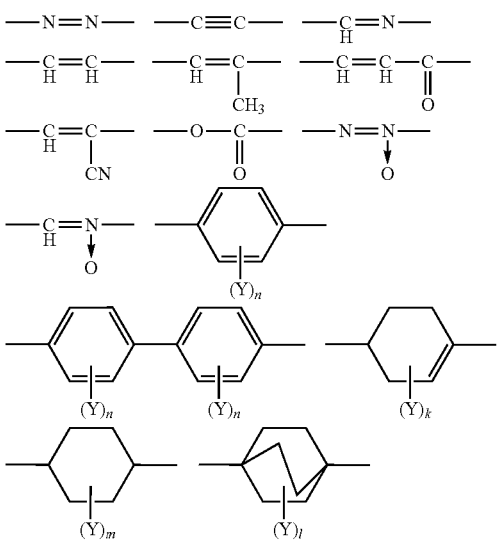

in which, in the Group (I) consisting of divalent groups, each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group; each n independently represents an integer from 0 to 4; k represents an integer from 0 to 7; m represents an integer from 0 to 8; and 1 represents an integer from 0 to 12.

<6> The epoxy resin according to any one of <1> to <5>, in which the siloxane structure comprises a structural unit derived from a siloxane compound having a functional group which is capable of reacting with an epoxy group.

<7> The epoxy resin according to <6>, in which the siloxane compound comprises two functional groups.

<8> The epoxy resin according to <6> or <7>, in which the siloxane compound comprises at least one compound comprising a structural unit represented by the following Formulae (3-1) to (3-3):

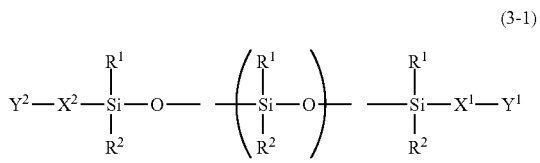

(3-1)

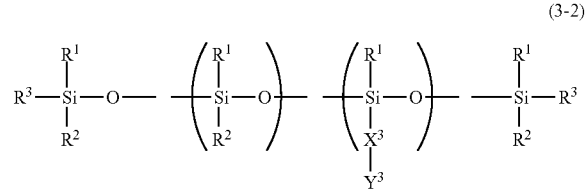

(3-2)

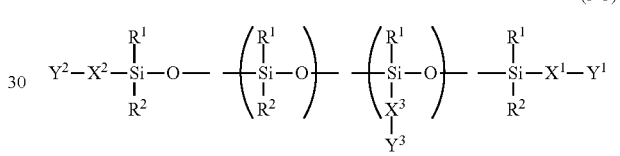

(3-3)

in which, in Formulae (3-1) to (3-3), each of $R^1$ to $R^3$ independently represents an alkyl group or a phenyl group; each of $Y^1$ to $Y^3$ independently represents an amino group, a carboxyl group, an acid anhydride group, a hydroxy group, an epoxy group, a mercapto group or an isocyanate group; each of $X^1$ to $X^3$ independently represents a divalent organic group; and a parenthesized portion means a structural unit, and one or more of which e exists in a molecule.

<9> The epoxy resin according to any one of <6> to <8>, in which a weight average molecular weight (Mw) of the siloxane compound is from 200 to 5000.

<10> The epoxy resin according to any one of <1> to <9>, in which a ratio, based on mass, (mesogenic structure: siloxane structure) of the mesogenic structure and the siloxane structure is from 10:1 to 10:30.

<11> The epoxy resin according to any one of <1> to <10>, in which the epoxy resin exhibits a liquid crystal phase.

<12> An epoxy resin composition, comprising the epoxy resin according to any one of <1> to <11>, and a curing agent.

<13> The epoxy resin composition according to <12>, further comprising a filler.

<14> The epoxy resin composition according to <13>, in which a content of the filler is from 45% by volume to 90% by volume, with respect to a total volume of all solids of the epoxy resin composition.

<15> The epoxy resin composition according to any one of <12> to <14>, in which the epoxy resin composition is capable of forming a high order structure.

<16> A resin sheet, comprising a resin composition layer comprising the epoxy resin composition according to any one of <12> to <15>.

<17> A B-stage sheet, comprising a semi-cured resin composition layer comprising a semi-cured product of the epoxy resin composition according to any one of <12> to <15>.

<18> The B-stage sheet according to <17>, in which the semi-cured resin composition layer comprises a high order structure.

<19> A C-stage sheet, comprising a cured resin composition layer comprising a cured product of the epoxy resin composition according to any one of <12> to <15>.

<20> The C-stage sheet according to <19>, in which the cured resin composition layer comprises a high order structure.

<21> A cured product of the epoxy resin composition according to any one of <12> to <15>.

<22> The cured product according to <21>, in which the cured product comprises a high order structure.

<23> A metal foil with resin, comprising:
a metal foil; and
a semi-cured resin composition layer that is provided on or above the metal foil and that comprises a semi-cured product of the epoxy resin composition according to any one of <12> to <15>.

<24> A metal substrate, comprising:
a metal support;
a cured resin composition layer that is provided on or above the metal support, and that comprises a cured product of the epoxy resin composition according to any one of <12> to <15>; and
a metal foil that is provided on or above the cured resin composition layer.

<25> A power semiconductor device, comprising:
a semiconductor module comprising a metal plate, a solder layer and semiconductor chip in this order;
a heat dissipator; and
a cured resin composition layer that is provided between the metal plate and the heat dissipator, and that comprises a cured product of the epoxy resin composition according to any one of <12> to <15>.

Advantageous Effects of Invention

The present invention can be provided an epoxy resin which cured product is superior in heat conductivity, and capable of achieving a low elasticity, as well as an epoxy resin composition, an epoxy resin composition, a resin sheet, a B-stage sheet, a C-stage sheet, a cured product, a metal foil with resin, a metal substrate, and a power semiconductor device using the epoxy resin.

DESCRIPTION OF EMBODIMENTS

Figure 1:
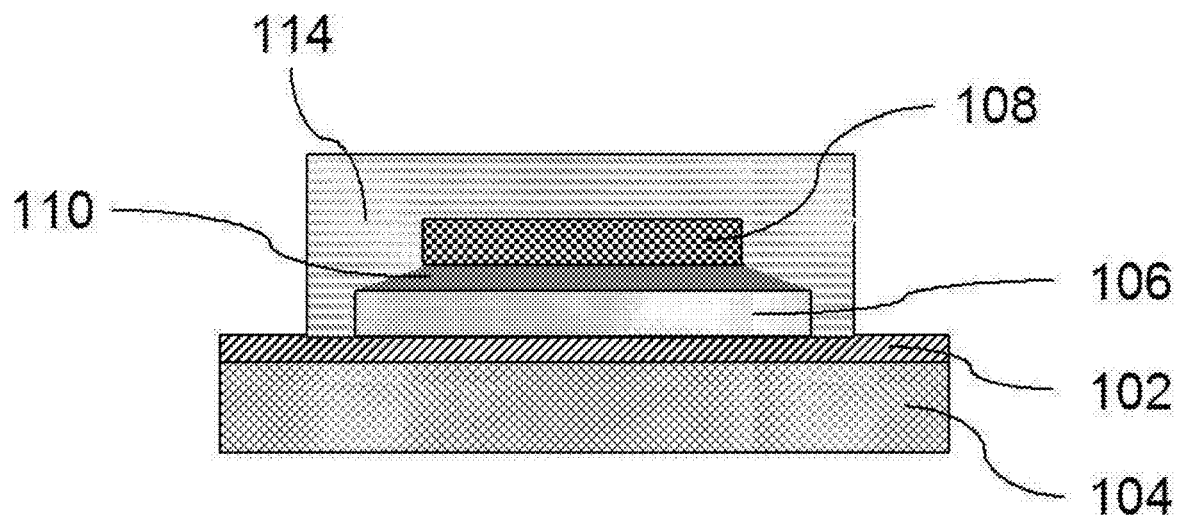
FIG. 1 is a schematic sectional view illustrating an example of configuration of a power semiconductor device in the present disclosure.

Hereinafter, embodiments of the present invention will be described in detail. However, the present invention is not limited to the following embodiments. In the following embodiments, the constituent elements (including the element processes and the like) are not indispensable except when particularly explicitly mentioned. The same applies to numerical values and ranges thereof, and does not limit the present invention.

In the present disclosure, the term "process" encompasses not only processes discrete from other processes but also processes which cannot be clearly distinguished from other processes, as long as the intended purpose of the process is achieved.

In the present disclosure, each numerical range specified using "(from) . . . to . . . " represents a range including the numerical values noted before and after "to" as the minimum value and the maximum value, respectively.

In the present disclosure, with respect to numerical ranges stated hierarchically herein, the upper limit or the lower limit of a numerical range of a hierarchical level may be replaced with the upper limit or the lower limit of a numerical range of another hierarchical level. Further, in the present disclosure, with respect to a numerical range, the upper limit or the lower limit of the numerical range may be replaced with a relevant value shown in any of Examples.

In the present disclosure, each component may include plural kinds of substances corresponding to the component. In a case in which plural kinds of substances exist corresponding to a component in the composition, the content means, unless otherwise specified, a total amount of the plural kinds of substances existing in the composition.

In the present disclosure, each component may include plural kinds of particles corresponding to the component. In a case in which plural kinds of particles exist corresponding to a component in the composition, the particle size means, unless otherwise specified, a value for a mixture of a plurality of kinds of particles present in the composition.

In the present disclosure, the term "layer" comprehends herein not only a case in which the layer is formed over the whole observed region where the layer is present, but also a case in which the layer is formed only on part of the region.

In the present disclosure, the term "layered" as used herein indicates that plural layers are piled up, in which two or more layers may be bonded to each other or detachable from each other.

<Epoxy Resin>

An epoxy resin in the present disclosure includes a mesogenic structure and a siloxane structure. Hereinafter, an epoxy resin having a mesogenic structure and a siloxane structure may be abbreviated as an "epoxy resin". The epoxy resin having such a constitution is excellent in heat conductivity and capable of achieving a low elasticity when cured. Although the reason therefor is not clear, it may be considered as follows.

An epoxy resin having a mesogenic structure has a nature that molecules are stacked in a cured product to develop liquid crystallinity. As a result, phonon scattering is suppressed, so that the heat conductivity can be superior.

Meanwhile, a siloxane compound is a material with a low elasticity. This is attributable to the bond distance, the bond angle and so on of a siloxane bond. The bond distance of a siloxane bond is 1.64 Å, which is longer than the bond distance of a carbon bond, namely 1.54 Å. Further, the bond angle of a siloxane bond is 134°, which is broader than the bond angle of a carbon bond, namely 110°. Therefore, a siloxane bond is more movable than a carbon bond, and as a result, a siloxane compound has a lower elasticity compared to an organic compound including a carbon bond.

However, in general, an epoxy resin has poor compatibility with a siloxane compound. Therefore, the mixture of an epoxy resin and a siloxane compound is inferior in dispersibility, and the respective advantages cannot be sufficiently exhibited. In particular, a compound having a mesogenic structure has extremely low compatibility due to its high degree of orientation.

On the other hand, an epoxy resin in the present disclosure has both a mesogenic structure and a siloxane structure in one molecule. By this structure, it is considered to be possible to eliminate the problem of poor compatibility, and to achieve both excellent heat conductivity and low elasticity.

In the present disclosure, the mesogenic structure refers to a structure that makes it easy to exhibits crystallinity or liquid crystallinity by a function of intermolecular interaction. Specific examples thereof include a biphenyl group, a terphenyl group, a phenylbenzoate group, a cyclohexylbenzoate group, an azobenzene group, a stilbene group, an anthracene group, a derivative thereof, and a group which these group is linked by an azomethine group, an ester group or the like. As the mesogenic structure includes a structure represented by the following Formula (1).

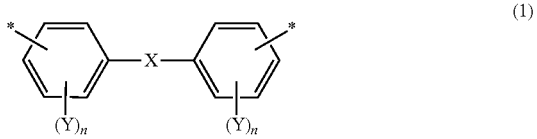

In Formula (1), X represents a single bond or at least one kind of linking group selected from the following Group (I) consisting of divalent groups. Each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group. Each n independently represents an integer from 0 to 4. * is a linking portion in a molecule.

Group (I) Consisting of Divalent Groups

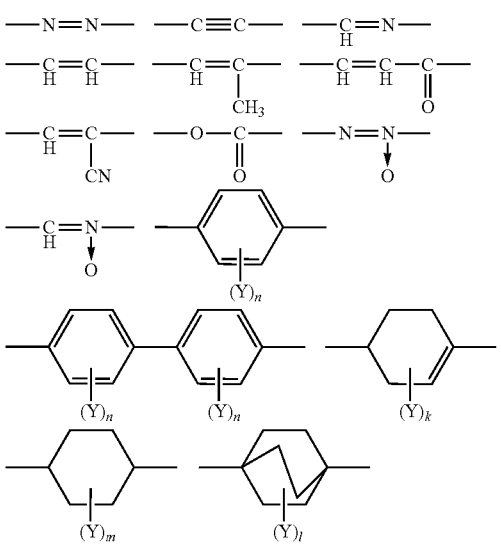

In the Group (I) consisting of divalent groups, each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group. Each n independently represents an integer from 0 to 4; k represents an integer from 0 to 7; m represents an integer from 0 to 8; and l represents an integer from 0 to 12.

In the Group (I) consisting of divalent groups, a linking direction of each divalent group may be any direction.

X in Formula (1) is preferably at least one kind of linking group selected from the following Group (II) consisting of divalent groups. Y, n, k, m, and l in Group (II) consisting of divalent groups are respectively the same as Y, n, k, m, and l in Group (I) consisting of a divalent group, and preferred embodiment is also the same.

Group (II) Consisting of Divalent Groups

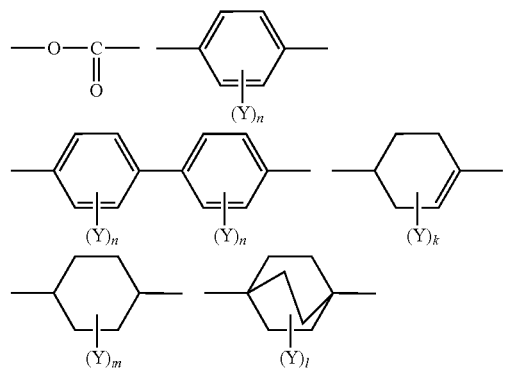

In Formula (1) and Group (I) consisting of divalent groups, it is preferable that each Y is independently an aliphatic hydrocarbon group having from 1 to 4 carbon atoms, an aliphatic alkoxy group having from 1 to 4 carbon atoms, a fluorine atom, a chlorine atom, a bromine atom, an iodine atom, a cyano group, a nitro group, or an acetyl group, it is more preferable that each Y is independently a methyl group, an ethyl group, a methoxy group, an ethoxy group, or chlorine atom, and it is still more preferable that each Y is independently a methyl group, or an ethyl group.

In Formula (1) and Group (I) consisting of divalent groups, it is preferable that each n is independently an integer from 0 to 2, and it is more preferable that each n is independently an integer from 0 or 1. k is preferably an integer from 0 to 3, and more preferably 0 or 1. m is preferably an integer from 0 to 4, and more preferably 0 or 1. l is preferably an integer from 0 to 4, and more preferably 0 or 1.

The mesogenic group has a structure in which three or more 6-membered ring groups are linearly connected, from the viewpoint of easily forming a high order structure to further improve a heat conductivity of a cured product thereof. The number of the linearly connected 6-membered ring groups is preferably 3 or more, and more preferably 3 or 4 from the viewpoint of moldability.

The linearly connected 6-membered ring group contained in the mesogenic group may be a 6-membered ring group derived from an aromatic ring such as benzene, or a 6-membered cyclic group derived from an aliphatic ring such as cyclohexane or cyclohexene. Among others, it is preferable that at least one is a 6-membered ring group derived from an aromatic ring, and it is more preferable that among the 6-membered ring groups linearly connected in the structure, one is an aliphatic ring, and the remaining rings are all aromatic rings.

Mesogenic structures in an epoxy resin may be included singly or in combination of two or more kinds.

In the present disclosure, the siloxane structure means a structure having —O—Si—O—. The remaining two bonds of Si are independently bonded to a siloxane structure or an organic group (R). Examples of the siloxane structure include a D unit ($R_2SiO_{2/2}$), a T unit ($RSiO_{3/2}$), and a Q unit ($SiO_{4/2}$). From the viewpoint of suppressing increase in viscosity of the obtained epoxy resin, it is preferable that the epoxy resin includes at least a D unit ($R_2SiO_{2/2}$). The content of D units in the total siloxane structure is preferably 90% by mass or more, more preferably 95% by mass, and further preferably 100% by mass.

Examples of an organic group bonded to Si include a group having an alkyl group, a phenyl group, an epoxy group, an amino group, a carboxyl group, a hydroxyl group, a mercapto group, or an isocyanate group. Such organic groups may have a substituent. Among these organic groups, at least one selected from the group consisting of an alkyl group and a phenyl group is preferable, and at least one selected from the group consisting of a methyl group and a phenyl group is more preferable.

Siloxane structures in an epoxy resin may be included singly or in combination of two or more kinds.

An epoxy resin in the present disclosure may be a monofunctional epoxy resin having one epoxy group, a bifunctional epoxy resin having two epoxy groups, or a multifunctional epoxy resin having three or more epoxy groups.

An epoxy group may be bonded to a siloxane structure or to a mesogenic structure, and is preferably bonded to a mesogenic structure. An epoxy group may be bonded directly to at least one selected from the group consisting of a siloxane structure and a mesogenic structure, or bonded via a linking group. Examples of the linking group include an alkylene group, an oxygen atom, a carbonyloxy group, and a combination thereof. At least one selected from the group consisting of an epoxy group, and an epoxy-containing group having an epoxy group and a linking group is preferably bonded to a mesogenic structure. Examples of the epoxy-containing group include a glycidyl group, a glycidyloxy group, and an epoxycyclohexyl group.

An epoxy resin may be linear or branched, and is preferably linear from the viewpoint of suppressing increase in viscosity.

A linear epoxy resin has a siloxane structure and a mesogenic structure in the main chain. A branched epoxy resin may have a siloxane structure as the main chain, and a mesogenic structure as a side chain, or it may have a mesogenic structure as the main chain and a siloxane structure as a side chain.

It is more preferable that the epoxy resin has a siloxane structure and the mesogenic structure in the main chain, and at least part of the mesogenic structure includes at least one selected from the group consisting of the epoxy group and the epoxy-containing group.

The siloxane structure and the mesogenic structure in the epoxy resin may be directly linked together, or may be linked via a linking group, and it is preferable that they are linked via a linking group. As a linking group between the siloxane structure and the mesogenic structure, there is, for example, a divalent group generated by a reaction of at least one selected from the group consisting of the epoxy group and the epoxy-containing group with a functional group which is capable of reacting with an epoxy group.

Examples of the functional group which is capable of reacting with an epoxy group include a functional group containing an active hydrogen, such as an amino group, a carboxyl group, an acid anhydride group, a hydroxyl group, an epoxy group, a mercapto group, or an isocyanate group.

A ratio of the mesogenic structure to the siloxane structure in an epoxy resin (mesogenic structure:siloxane structure) based on mass is preferably from 10:1 to 10:30, more preferably from 10:3 to 10:20, and further preferably from 10:4 to 10:15.

The ratio of the mesogenic structure to the siloxane structure in an epoxy resin can be measured by NMR, MALDI-TOF-MS, or the like.

An epoxy equivalent of the epoxy resin is preferably from 250 g/eq to 4000 g/eq, more preferably from 250 g/eq to 2000 g/eq, and further preferably from 300 g/eq to 1000 g/eq.

In the present disclosure, the epoxy equivalent of an epoxy resin is measured by perchloric acid titration.

A weight average molecular weight (Mw) of an epoxy resin measured by gel permeation chromatography (GPC) is preferably from 500 to 10,000, more preferably from 500 to 8,000, and further preferably from 600 to 5000 from the viewpoint of satisfying both the fluidity of an epoxy resin composition and the heat conductivity of a cured product.

In the present disclosure, the weight average molecular weight (Mw) is measured by gel permeation chromatography (GPC method).

For a measurement by the gel permeation chromatography, a commercially available instrument can be used. As an example, using a pump: L-6000 (Hitachi, Ltd.), a column: TSKGEL G4000HR+G3000HR+G2000XL (Tosoh Corporation), a detector: differential refractometer RI-8020 (Tosoh Corporation), and an elution solvent: tetrahydrofuran (without stabilizer for chromatography, Wako Pure Chemical Industries, Ltd.), a sample prepared by dissolving a resin sample in tetrahydrofuran to a concentration of 5 mg/cm$^3$ is measured at a flow rate of 1.0 cm$^2$/min.

A calibration curve is prepared using polystyrene standard samples, and the weight average molecular weight (Mw) of an epoxy resin relative to polystyrene is calculated.

The epoxy resin in the present disclosure forms a high-order structure in a cured product thereof. Herein, the high-order structure means a structure including a high order structure in which its constituent elements are arranged to form a micro ordered structure, and, for example, corresponds to a crystal phase and a liquid crystal phase. Whether such a high order structure exists or not can be determined by observation with a polarization microscope. In other words, in a case in which interference fringes due to depolarization are found in the observation in a crossed-Nicols state, it can be determined that a high order structure exists.

Examples of a liquid crystalline phase include a nematic structure and a smectic structure. The nematic structure is a high order structure in which the long molecular axes are oriented in a uniform direction and have only orientation order. On the other hand, the smectic structure is a high-ordered structure having a one-dimensional positional order and a layer structure in addition to orientation order. Therefore, the orderliness of the molecule is higher in the smectic structure than in the nematic structure.

<Method of Producing Epoxy Resin>

There is no particular restriction on an epoxy resin in the present disclosure, insofar as it can be produced to have a mesogenic structure, an epoxy group, and a siloxane structure.

For example, an epoxy resin in the present disclosure can be yielded by reacting an epoxy compound having a mesogenic structure (hereinafter also referred to as "mesogen-containing epoxy compound"), with a siloxane compound having a functional group which is capable of reacting with an epoxy group (hereinafter also referred to as "reactive siloxane compound"). Mesogen-containing epoxy compounds, or reactive siloxane compounds may be respectively used singly or in combination of two or more kinds thereof.

The mesogen-containing epoxy compound has a mesogenic structure and an epoxy group. The epoxy group in the mesogen-containing epoxy compound may be also an epoxy-containing group. The "mesogenic structure" and "epoxy-containing group" in a mesogen-containing epoxy compound are the same as those described in connection with the mesogenic structure.

A mesogen-containing epoxy compound preferably has two or more epoxy groups, and it preferably has just two epoxy groups, from the viewpoint that the resulting epoxy resin becomes linear.

Examples of a mesogen-containing epoxy compound include epoxy compounds represented by Formula (2).

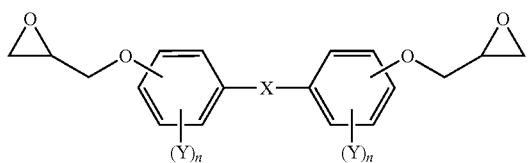

(2)

X, Y and n in Formula (2) are respectively the same as X, Y and n for the mesogenic structure in Formula (1). The same applies to the preferred range.

The epoxy compound represented by Formula (2) preferably contains at least one selected from the group consisting of 1-{(3-methyl-4-oxiranylmethoxy)phenyl)-4-4-(4-oxiranylmethoxyphenyl)-1-cyclohexene, 1-(3-methyl-4-oxiranylmethoxyphenyl)-4-(4-oxiranylmethoxyphenyl) benzene, 2-methyl-1,4-phenylene-bis{4-(2,3-epoxypropoxy)benzoate}, 4-{4-(2,3-epoxypropoxy) phenyl}cyclohexyl=4-(2,3-epoxypropoxy)-3-methylbenzoate, and 4-{4-(2,3-epoxypropoxy) phenyl}cyclohexyl=4-(2,3-epoxypropoxy)benzoate, as the epoxy compound represented by Formula (2), from the viewpoint of exhibiting a temperature range of 25° C. or higher in which a liquid crystal phase is exhibited, a high orientation property of the liquid crystal phase of a cured product, and excellent gas barrier properties.

The epoxy compound represented by Formula (2) may be produced by a publicly known method. For example, the epoxy compound represented by Formula (2) can be obtained by a production method described in Japanese Patent No. 4619770, Japanese Patent Application Laid-Open (JP-A) No. 2011-98952, Japanese Patent No. 5471975, or the like.

The reactive siloxane compound has a "siloxane structure" and a "functional group which is capable of reacting with an epoxy group". The "siloxane structure" in a reactive siloxane compound is the same as those described in connection with the siloxane structure.

The reactive siloxane compound preferably has two or more functional groups reactive with an epoxy group. From the viewpoint that the resulting epoxy resin becomes linear, it preferably has just two functional groups reactive with an epoxy group.

The reactive siloxane compound includes, for example, a compound having a structural unit represented by the following Formulae (3-1) to (3-3):

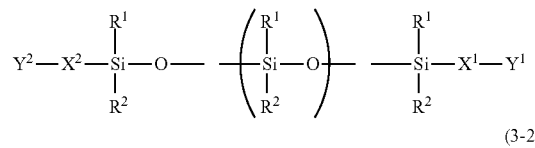

(3-1)

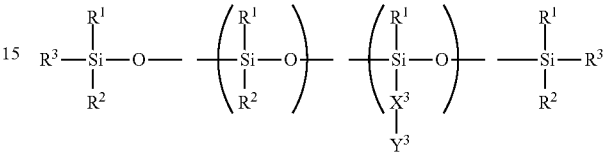

(3-2)

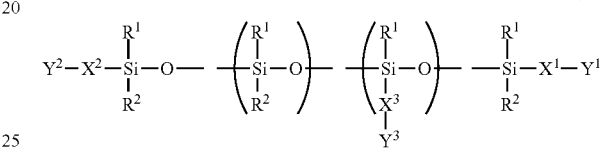

(3-3)

In Formulae (3-1) to (3-3), each of $R^1$ to $R^3$ independently represents an alkyl group or a phenyl group; each of $Y^1$ to $Y^3$ independently represents an amino group, a carboxyl group, an acid anhydride group, a hydroxy group, an epoxy group, a mercapto group or an isocyanate group; each of $X^1$ to $X^3$ independently represents a divalent organic group; a parenthesized portion means a structural unit, one or more of which exists in a molecule.

Examples of an alkyl group represented by any of $R^1$ to $R^3$ include a methyl group, an ethyl group and a propyl group, and a methyl group is preferable.

An alkyl group or a phenyl group represented by any of $R^1$ to $R^3$ may each have a substituent.

Examples of a divalent organic group represented by any of $X^1$ to $X^3$ include an alkylene group, a phenylene group, an alkyleneoxyalkyl group, and a combination thereof. The alkylene group, phenylene group, and alkyleneoxyalkyl group may have a substituent.

The carbon number of an alkylene group represented by any of $X^1$ to $X^3$ is preferably from 1 to 6, and more preferably from 1 to 3.

The carbon number of an alkylene group in an alkyleneoxyalkyl group represented by any of $X^1$ to $X^3$ is preferably from 1 to 6, and more preferably from 1 to 3. The carbon number of an alkyl group in an alkyleneoxyalkyl group represented by any of any of $X^1$ to $X^3$ is preferably from 1 to 6, and more preferably from 1 to 3.

$Y^1$ to $Y^3$ are preferably a carboxyl group, an amino group, or a hydroxyl group, more preferably an amino group or a phenolic hydroxyl group, and further preferably a phenolic hydroxyl group.

The reactive siloxane compound among compounds having a structural unit represented by any of Formulas (3-1) to (3-3) is preferably a compound having a structural unit represented by Formula (3-1). Since a compound having a structural unit represented by Formula (3-1) has a functional group at the terminal, the resulting epoxy resin is apt to become linear, and increase in viscosity tends to be suppressed.

A weight average molecular weight (Mw) of the reactive siloxane compound is preferably from 200 to 5,000, more preferably from 300 to 3,500, and further preferably from 500 to 2,000 from the viewpoint of miscibility and reactivity with the mesogen-containing epoxy compound.

Examples of a commercially available product of a siloxane diamine, for which $Y^1$ and $Y^2$ in Formula (3-1) are an amino group, include "KF-8010" (amine equivalent: 430), "X-22-161A" (amine equivalent: 800), "X-22-161B" (amine equivalent: 1500), "KF-8012" (amine equivalent: 2200), "KF-8008" (amine equivalent: 5700), "X-22-9409" (amine equivalent: 700), "X-22-1660B-3" (amine equivalent: 2200) (all the above are trade names of Shin-Etsu Chemical Co., Ltd.), "XF42-C5379" (trade name of Momentive Performance Materials Japan LLC; amine equivalent: 740), "BY-16-853U" (amine equivalent: 460), "BY-16-853" (amine equivalent: 650), and "BY-16-853B" (amine equivalent: 2200) (the above are trade names of Dow Corning Toray Co., Ltd.).

Among these siloxane diamines, from the viewpoint of solubility with an epoxy resin and a solvent, "KF-8010" (amine equivalent: 430), "X-22-161A" (amine equivalent: 800), "BY-16-853U" (amine equivalent: 460), and "BY-16-853" (amine equivalent: 650) which have a small amine equivalent are preferred.

Examples of a commercially available product of a compound, for which $Y^1$ and $Y^2$ in Formula (3-1) are a phenolic hydroxyl group, include "X-22-1876" (hydroxyl value: 120 KOHmg/g), "KF-2201" (hydroxyl value: 35 KOHmg/g), "X-22-1822" (hydroxyl value: 20 KOHmg/g) (all the above are trade names of Shin-Etsu Chemical Co., Ltd.), and "BY16-752A" (hydroxyl value: 30 KOHmg/g, trade name of Dow Corning Toray Co., Ltd.).

Examples of a commercially available product of a compound, for which $Y^1$ and $Y^2$ in Formula (3-1) are an alcoholic hydroxyl group, include "X-22-160AS" (hydroxyl value: 112 KOHmg/g), "KF-6001" (hydroxyl value: 62 KOHmg/g), "KF-6002" (hydroxyl value: 35 KOHmg/g), "KF-6003" (hydroxyl value: 20 KOHmg/g), and "X-22-4015" (hydroxyl value: 27 KOHmg/g) (all the above are trade names of Shin-Etsu Chemical Co., Ltd.).

Examples of a commercially available product of a compound, for which $Y^1$ and $Y^2$ in Formula (3-1) are a carboxyl group, include "X-22-162AS" (carboxyl equivalent: 420 g/Eq), "X-22-162A" (carboxyl equivalent: 865 g/eq) (the above are trade names of Shin-Etsu Chemical Co., Ltd.).

It is possible to react a mesogen-containing epoxy compound and a reactive siloxane compound in a solvent. There is no particular restriction on the solvent used in this reaction, and, for example, it is preferable to use at least one selected from cyclohexanone, toluene, xylene, or mesitylene. The solvents may be used singly or in combination of two or more kinds thereof.

An used amount of the solvent is preferably from 25 parts by mass to 1000 parts by mass, more preferably from 50 parts by mass to 500 parts by mass, based on 100 parts by mass of a total amount of the mesogen-containing epoxy compound and the reactive siloxane compound. In a case in which the used amount of the solvent is from 25 parts by mass to 1000 parts by mass, the solubility becomes sufficient and prolongation of the reaction time tends to be suppressed.

A curing catalyst may be used for this reaction. There is no particular restriction on the kind of the curing catalyst, and an appropriate one may be selected from the viewpoint of reaction rate, reaction temperature, storage stability, or the like. Specific examples of the curing catalyst include an imidazole compound, an organic phosphorus compound, a tertiary amine, and a quaternary ammonium salt. These may be used singly or in combination of two or more kinds thereof. Among these, at least one selected from the group consisting of an organic phosphine compound; a compound having intramolecular polarization obtained by adding a compound having a π bond, such as maleic anhydride, a quinone compound (1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4benzoquinone, 2,3-dimethoxy-1,4-benzoquinone, phenyl-1,4-benzoquinone, or the like), diazophenylmethane, or a phenol resin, to an organic phosphine compound; and a complex of an organic phosphine compound and an organic boron compound (tetraphenyl borate, tetra-p-tolyl borate, tetra-n-butyl borate, or the like), is preferable from the viewpoint of heat resistance of a molded product.

Specific examples of the organic phosphine compounds include triphenyl phosphine, diphenyl(p-tolyl)phosphine, tris(alkylphenyl)phosphine, tris(alkoxyphenyl)phosphine, tris(alkylalkoxyphenyl)phosphine, tris(dialkylphenyl)phosphine, tris(trialkylphenyl)phosphine, tris(tetraalkylphenyl) phosphine, tris(dialkoxyphenyl)phosphine, tris(trialkoxyphenyl)phosphine, tris(tetraalkoxyphenyl)phosphine, trialkyl phosphine, dialkylaryl phosphine, and alkyldiaryl phosphine.

A content of the curing catalyst is not particularly limited. From the viewpoint of reaction speed and storage stability, the content of the curing catalyst is preferably from 0.1% by mass to 3% by mass, more preferably from 0.2% by mass to 1.5% by mass, with respect to the total mass of the mesogen-containing epoxy compound and the reactive siloxane compound.

An appropriate temperature and time for reacting the mesogen-containing epoxy compound and the reactive siloxane compound may be selected according to a kind of the mesogen-containing epoxy compound and the reactive siloxane compound. For example, a reaction temperature may be set to be from 70° C. to 150° C., and preferably from 100° C. to 130° C. A reaction time may be set to be from 0.1 hours to 10 hour, and preferably from 1 hour to 6 hours.

A ratio of the number of equivalents of the epoxy group in the mesogen-containing epoxy resin and the number of equivalents of the functional group which is capable of reacting with an epoxy group in the reactive siloxane compound, that is, the ratio is the number of equivalents of the epoxy group/the number of equivalents of the functional group, is preferably from 1.1 to 10.5, and more preferably from 1.8 to 5.2.

A content, based on mass, of the mesogen-containing epoxy resin and the reactive siloxane compound, that is, the mesogen-containing epoxy resin:the reactive siloxane compound, is preferably from 10:1 to 10:30, more preferably from 10:3 to 10:20, and still more preferably from 10:4 to 10:15.

The content of the mesogen structure and the siloxane structure in the epoxy resin may be measured by NMR, MALDI-TOF-MS, and so on.

<Epoxy Resin Composition>

An epoxy resin composition in the present disclosure contains an epoxy resin in the present disclosure and a curing agent. The epoxy resin composition in the present disclosure is excellent in heat conductivity and has a low elasticity, when it is cured. If necessary, an epoxy resin composition in the present disclosure may contain another component in addition to the above components. It may further contain as such another component, a filler, a curing catalyst, a silane coupling agent, a solvent, a release agent, a stress relaxation agent, a reinforcing material, an elastomer, a dispersant, an anti-settling agent, or the like.

Since an epoxy resin composition in the present disclosure contains an epoxy resin in the present disclosure, a high order structure can be formed. An epoxy resin composition in the present disclosure can be used, for example, as a sealing material or a molding material.

(Epoxy Resin)

The epoxy resin in the epoxy resin composition is the epoxy resin described above.

A content of the epoxy resin in the epoxy resin composition is preferably from 5% by mass to 30% by mass, more preferably from 7% by mass to 28% by mass, and still more preferably from 10% by mass to 25% by mass.

(Curing Agent)

The curing agent is not particularly restricted as long as it is a compound capable of undergoing a curing reaction with the epoxy resin, and any curing agent that is usually used may be selected as appropriate. Specific examples of the curing agent include an acid anhydridic curing agent, an aminic curing agent, a phenolic curing agent, or a mercaptanic curing agents. These curing agents may be used singly, or in combination of two or more kinds thereof.

Among these, from the viewpoint of heat resistance, it is preferred to use, as a curing agent, at least one selected from the group consisting of an aminic curing agent and a phenolic curing agents. From the viewpoint of storage stability, it is more preferred to use at least one phenolic curing agent.

As the amineic curing agent, one which is usually used as a curing agent of an epoxy resin may be used with no particular restriction, and any commercially available aminic curing agent may be used as well. Particularly, the amineic curing agent is preferably a polyfunctional curing agent having two or more functional groups from the viewpoint of curing properties, and more preferably a polyfunctional curing agent having a rigid structure from the viewpoint of heat conductivity.

Specific examples of a bifunctional aminic curing agent include 4,4'-diaminodiphenylmethane, 4,4'-diaminodiphenyl ether, 4,4'-diaminodiphenylsulfone, 4,4'-diamino-3,3'-dimethoxybiphenyl, 4,4'-diaminophenylbenzoate, 1,5-diaminonaphthalene, 1,3-diaminonaphthalene, 1,4-diaminonaphthalene, and 1,8-diaminonaphthalene.

From the viewpoint of heat conductivity, at least one selected from the group consisting of 4,4'-diaminodiphenylmethane, 1,5-diaminonaphthalene and 4,4'-diaminodiphenylsulfone is preferred, and 1,5-diaminonaphthalene is more preferred.

As the phenolic curing agent, one which is usually used as a curing agent of an epoxy resin may be used with no particular restriction, and any commercially available phenolic curing agent may be used as well. For example, a phenol compound, and a novolac phenol resin of a phenol compound can be used.

Examples of the phenolic curing agent include: a monofunctional compound such as phenol, o-cresol, m-cresol or p-cresol; a bifunctional compound such as catechol, resorcinol or hydroquinone; and a trifunctional compound such as 1,2,3-trihydroxybenzene, 1,2,4-trihydroxybenzene or 1,3,5-trihydroxybenzene. As the curing agent, a phenol novolac resin in which a phenol compound is linked with a methylene chain or the like may also be used.

Examples of the phenol novolac resin can include novolac resins of one phenol compound, such as a cresol novolac resin, a catechol novolac resin, a resorcinol novolac resin, and a hydroquinone novolac resin; and novolac resins of two or more phenol compounds, such as a catechol resorcinol novolac resin and a resorcinol hydroquinone novolac resin.

In a case in which a phenol novolac resin is used as a phenolic curing agent, the phenol novolac resin preferably includes a compound having a structural unit represented by at least one selected from the group consisting of the following Formula (II-1) and the following Formula (II-2).

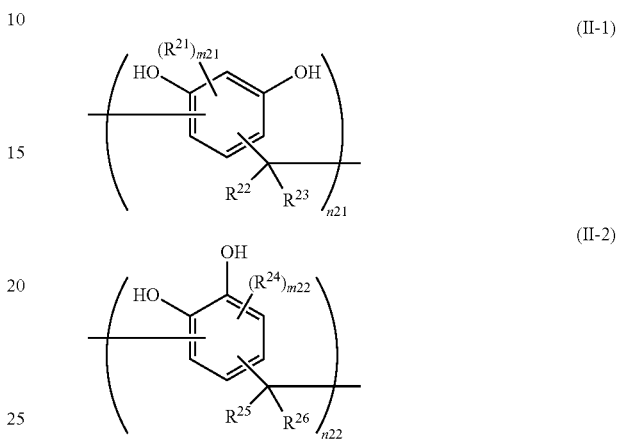

In Formulae (II-1) and (II-2), each of $R^{21}$ and $R^{24}$ independently represents an alkyl group, an aryl group or an aralkyl group. Each of $R^{22}$, $R^{23}$, $R^{25}$ and $R^{26}$ independently represents a hydrogen atom, an alkyl group, an aryl group or an aralkyl group. Each of $m^{21}$ and $m^{22}$ independently represents an integer from 0 to 2. Each of $n^{21}$ and $n^{22}$ independently represents an integer from 1 to 7.

The alkyl group may be in any of a linear form, a branched form, and a cyclic form.

The aryl group may have a structure containing a hetero atom in an aromatic ring. In this case, the aryl group is preferably a heteroaryl group in which a total number of the hetero atom and carbon atoms is from 6 to 12.

The alkylene group in the aralkyl group may be in any of a linear form, a branched form, and a cyclic form. The aryl group in the aralkyl group may have a structure containing a hetero atom in an aromatic ring. In this case, the aryl group is preferably a heteroaryl group in which a total number of the hetero atom and carbon atoms is from 6 to 12.

In Formulae (II-1) and (II-2), each of $R^{21}$ and $R^{24}$ independently represents an alkyl group, an aryl group or an aralkyl group. The alkyl group, the aryl group, and the aralkyl group may further have a substituent. Examples of the substituent include an alkyl group (except a case in which $R^{21}$ or $R^{24}$ is an alkyl group), an aryl group, a halogen atom and a hydroxyl group.

Each of $m^{21}$ and $m^{22}$ independently represents an integer from 0 to 2, and in a case in which $m^{21}$ or $m^{22}$ represents 2, two $R^{21}$ or $R^{24}$ may be the same as or different from each other. Each of $m^{21}$ and $m^{22}$ independently preferably represents 0 or 1, and more preferably 0.

Each of $n^{21}$ and $n^{22}$ means a number of structure unit(s) represented by Formula (II-1) and the formula (II-2) included in a phenol novolac resin, and independently represents an integer from 1 to 7.

In Formulae (II-1) and (II-2), each of $R^{22}$, $R^{23}$, $R^{25}$ and $R^{26}$ independently represents a hydrogen atom, an alkyl group, an aryl group or an aralkyl group. The alkyl group, the aryl group, and the aralkyl group represented by each of $R^{22}$, $R^{23}$, $R^{25}$ and $R^{26}$ may further have a substituent. Examples of the substituent include an alkyl group (except a case in which $R^{22}$ $R^{23}$ $R^{25}$ or $R^{26}$ is an alkyl group), an aryl group, a halogen atom and a hydroxyl group.

$R^{22}$ $R^{23}$ $R^{25}$ and $R^{26}$ in Formulae (II-1) and (II-2) each independently preferably represent a hydrogen atom, an alkyl group or an aryl group, more preferably a hydrogen atom, an alkyl group having 1 to 4 carbon atoms or an aryl group having 6 to 12, and still more preferably a hydrogen atom, from the viewpoints of storage stability and heat conductivity.

Further, at least one of $R^{22}$ or $R^{23}$ preferably represent an aryl group, and more preferably an aryl group having 6 to 12 carbon atoms. At least one of $R^{25}$ or $R^{26}$ preferably represent an aryl group, and more preferably an aryl group having 6 to 12 carbon atoms.

The aryl group may be a structure in which the aromatic ring includes a hetero atom. In the case, the structure is preferably a heteroaryl group whose total number of hetero atoms and carbon atoms is form 6 to 12.

The phenolic curing agent may singly include a compound having a structural unit represented by Formula (II-1) or the Formula (II-2), or in combination of two or more kinds thereof. It is preferable that at least one compound having a structural unit derived from resorcinol represented by Formula (II-1) is included.

The compound having a structural unit represented by Formula (II-1) may further include at least one partial structure derived from a phenol compound other than resorcinol. Examples of the partial structure derived from the phenol compound other than resorcinol include, for example, a partial structure derived from phenol, cresol, catechol, hydroquinone, 1,2,3-trihydroxybenzene, 1,2,4-trihydroxybenzene and 1,3,5-trihydroxybenzene. The partial structure derived from them may be included singly or in combination of two or more kinds thereof.

The compound having the structural unit represented by Formula (II-2) may further include at least one partial structure derived from a phenol compound other than catechol. Examples of the partial structure derived from the phenol compound other than catechol include, for example, a partial structure derived from phenol, cresol, resorcinol, hydroquinone, 1,2,3-trihydroxybenzene, 1,2,4-trihydroxybenzene and 1,3,5-trihydroxybenzen. The partial structure derived from them may be included singly or in combination of two or more kinds thereof.

The partial structure derived from a phenol compound as used herein means a monovalent or divalent group formed by removing one or two hydrogen atoms from the benzene ring moiety of a phenol compound. The position(s) at which hydrogen atom(s) is/are removed is/are not particularly limited.

A content of the partial structure derived from resorcinol in the compound having the structural unit represented by Formula (II-1) is not particularly limited. The content of the partial structure derived from resorcinol with respect to a total mass of the compound having the structural unit represented by Formula (II-1) is preferably 55% by mass or more from the viewpoint of elastic modulus, more preferably 80% by mass or more from the viewpoints of the glass transition temperature (Tg) and the linear expansion coefficient, and still more preferably 90% by mass or more from the viewpoint of heat conductivity.

The phenol novolac resin preferably also includes a novolac resin having a partial structure represented by at least one selected from the group consisting of the following Formula (III-1) to the following Formula (III-4).

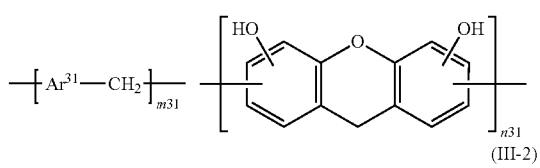

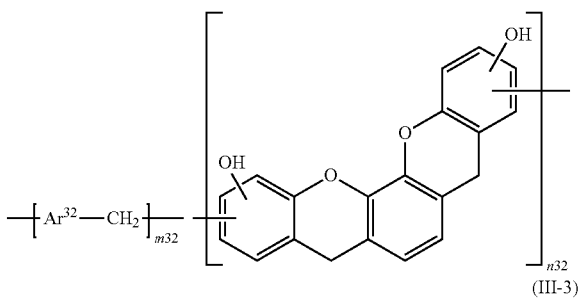

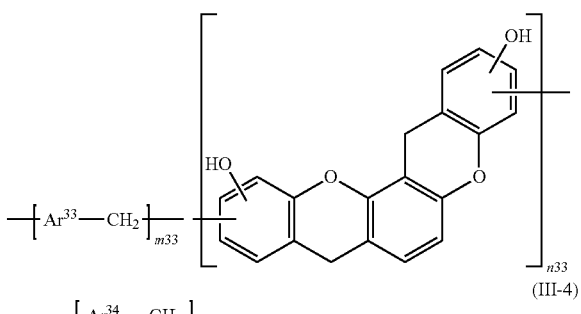

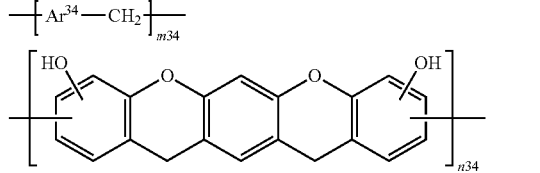

In Formulae (III-1) to (III-4), each of m31 to m34 and n31 to n34 independently represents a positive integer, and mean a numbers of structural units to be included, respectively. Each of $Ar^{31}$ to $Ar^{34}$ independently represents a group represented by the following Formulae (III-a) or (III-b).

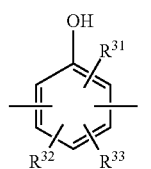

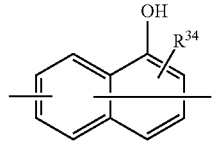

In Formulae (III-a) and (III-b), each of $R^{31}$ and $R^{34}$ independently represents a hydrogen atom or a hydroxyl group; and each of $R^{32}$ and $R^{33}$ independently represents a hydrogen atom, or an alkyl group having 1 to 8 carbon atoms.

The curing agent having a partial structure represented by at least one selected from the group consisting of Formulae (III-1) to (III-4) is a compound capable of being generated as a by-product by a method of producing a novolac compound of the divalent phenol compound.

The partial structure represented by Formulae (III-1) to (III-4) may be included as a main chain structure of a compound, or may be included as a part of a side chain of the compound. Respective structural units forming the partial structure represented by any one of Formulae (III-1) to (III-4) may be randomly included, may be regularly included, or may be included in a block manner. A position of substitution with a hydroxyl group in Formulae (III-1) to (III-4) is not particularly limited as long as the position is on an aromatic ring.

All of the plurality of $Ar^{31}$ to $Ar^{34}$ presented in each of Formulae (III-1) to (III-4) may be the same atom group, or the plurality of $Ar^{31}$ to $Ar^{34}$ may include two or more atom groups. Each of $Ar^{31}$ to $Ar^{34}$ represents a group represented by any one of Formulae (III-a) and (III-b).

Each of $R^{31}$ and $R^{34}$ independently represents a hydrogen atom or hydroxyl group, and preferably represents a hydroxyl group from the viewpoint of heat conductivity. A position of substitution with each of $R^{31}$ and $R^{34}$ is not particularly limited.

Each of $R^{32}$ and $R^{33}$ in Formula (III-a) independently represents a hydrogen atom, or an alkyl group having 1 to 8 carbon atoms. Examples of the alkyl group having 1 to 8 carbon atoms in $R^{32}$ or $R^{33}$ include a methyl group, an ethyl group, a n-propyl group, an isopropyl group, a n-butyl group, an isobutyl group, a t-butyl group, a pentyl group, a hexyl group, a heptyl group and an octyl group. The position of substitution with each of $R^{32}$ and $R^{33}$ in Formula (III-a) is not particularly limited.

From the viewpoint of achieving a more superior heat conductivity, $Ar^{31}$ to $Ar^{34}$ in Formulae (III-1) to (III-4) preferably represents at least one selected from the group consisting of a group derived from dihydroxybenzene, the group in which $R^{31}$ represents a hydroxyl group and each of $R^{32}$ and $R^{33}$ represent a hydrogen atom in Formula (III-a); and a group derived from dihydroxynaphthalene, the group in which $R^{34}$ in Formula (III-b) represents a hydroxyl group.

The "group derived from dihydroxybenzene" as used herein means a divalent group formed by removing two hydrogen atoms from the aromatic moiety of dihydroxybenzene, and the positions from which two hydrogen atoms are removed are not particularly limited. The same applies to the "group derived from dihydroxynaphthalene".

Each of $Ar^{31}$ to $Ar^{34}$ more preferably represents a group derived from dihydroxybenzene, and still more preferably represents at least one selected from the group consisting of a group derived from 1,2-dihydroxybenzene (catechol) and a group derived from 1,3-dihydroxybenzene (resorcinol), from the viewpoints of productivity and fluidity of the resin composition. It is preferable that each of $Ar^{31}$ to $Ar^{34}$ includes at least a group derived from resorcinol from the viewpoint of particularly improving heat conductivity. It is preferable that the structural unit, in which n31 to n34 is attached, includes a group derived from resorcinol from the viewpoint of particularly improving heat conductivity.

In a case in which the compound having a partial structure represented by at least one selected from the group consisting of Formulae (III-1) to (III-4) includes a structural unit derived from resorcinol, a content of the structural unit derived from resorcinol with respect to a total weight of the compound having a structure represented by at least one selected from the group consisting of Formulae (III-1) to (III-4) is preferably 55% by mass or more, from the viewpoint of elastic modulus. The content is more preferably 80% by mass or more, and still more preferably 90% by mass or more, from the viewpoints of the glass transition temperature (Tg) and the linear expansion coefficient of a cured product, and is particularly preferably 90% by mass or more from the viewpoint of heat conductivity.

In Formulae (III-1) to (III-4), from the viewpoint of fluidity, the ratio of mx and nx (in which x represents the same value of any of one 31, 32, 33 and 34), mx/nx, is preferably from 20/1 to 1/5, more preferably from 20/1 to 5/1, and still more preferably from 20/1 to 10/1. From the viewpoint of fluidity, a total value of mx and nx, mx+nx, is preferably 20 or less, more preferably 15 or less, and still more preferably 10 or less. It is noted here that the lower limit of the total value of mx and nx is not particularly restricted.

The mx and nx each represent the number of the respective structural units and indicate the degree of addition of the corresponding structural unit in the molecule. Therefore, for a single molecule, the mx and nx each represent an integer value. In the case of an aggregate of plural molecules, the mx and nx in (mx/nx) and (mx+nx) each represent a rational number as an average value.

In particular, in a case in which each of $Ar^{31}$ to $Ar^{34}$ represents at least one of substituted or unsubstituted dihydroxybenzene or substituted or unsubstituted dihydroxynaphthalene, the phenol novolac resin having a partial structure represented by at least one selected from the group consisting of Formulae (III-1) to (III-4) tends to be easily synthesized and tends to provide a curing agent having a lower melting point, as compared with a simple novolac resin or the like of such dihydroxybenzene or dihydroxynaphthalene. Accordingly, an advantage is that a resin composition including such a phenol resin as a curing agent is also easily produced and handled.

The presence or absence of the partial structure represented by at least one selected from the group consisting of Formulae (III-1) to (III-4) in a phenol novolac resin may be identified by field desorption mass spectrometry (FD-MS), judging whether or not a component corresponding to the partial structure represented by at least one selected from the group consisting of Formulae (III-1) to (III-4) includes as a fragment element.

A molecular weight of the phenol novolac resin having a partial structure represented by at least one selected from the group consisting of Formulae (III-1) to (III-4) is not particularly limited. A number average molecular weight (Mn) thereof is preferably 2,000 or less, more preferably 1,500 or less, and still more preferably from 350 to 1,500, from the viewpoint of fluidity. A weight average molecular weight (Mw) thereof is preferably 2,000 or less, more preferably 1,500 or less, and still more preferably from 400 to 1,500.

A hydroxyl equivalent of the phenol novolac resin having a partial structure represented by at least one selected from the group consisting of Formulae (III-1) to (III-4) is not particularly limited. An average of the hydroxyl equivalent thereof is preferably from 45 g/eq to 150 g/eq, more preferably from 50 g/eq to 120 g/eq, and still more preferably from 55 g/eq to 120 g/eq, from the viewpoint of crosslinking density involved in heat resistance. The hydroxyl equivalent means a value measured according to JIS K 0070:1992.

The phenol novolac resin may include a monomer which is a phenol compound that forms the phenol novolac resin. The content (hereinafter, also referred to as "monomer content") of the monomer, which is a phenol compound that forms the phenol novolac resin, is not particularly limited.

The monomer content in the phenol novolac resin is preferably from 5% by mass to 80% by mass, more preferably from 15% by mass to 60% by mass, and still more preferably from 20% by mass to 50% by mass, from the viewpoints of heat conductivity and moldability.

In a case in which the monomer content is 80% by mass or less, an amount of a monomer not contributing to cross-linking in a curing reaction is decreased, and the amount of cross-linked high-molecular-weight product is increased, whereby a higher-order structure having a higher density is formed, and heat conductivity is improved. In a case in which the monomer content is 5% by mass or more, flowing during molding easily occurs and adhesiveness with the filler, which is optionally included, is more enhanced, whereby more superior heat conductivity and heat resistance are attained.

A content of the curing agent in the resin composition is not particularly limited. For example, in a case in which the curing agent is amine curing agent, a ratio of the number of equivalents of active hydrogen in the amine curing agent (the number of equivalents of active hydrogen) and the number of equivalents of the epoxy group in the epoxy resin, that is, the ratio is the number of equivalents of active hydrogen/the number of equivalents of the epoxy group, is preferably from 0.5 to 2.0, and more preferably from 0.8 to 1.2. In a case in which the curing agent is phenolic curing agent, a ratio of the number of equivalents of the phenolic hydroxyl group in the phenolic curing agent (the number of equivalents of the phenolic hydroxyl group) and the number of equivalents of the epoxy group in the epoxy resin, that is, the ratio is the number of equivalents of the phenolic hydroxyl group/the number of equivalents of the epoxy group, is preferably from 0.5 to 2, and more preferably from 0.8 to 1.2.

(Curing Accelerator)

The resin composition may contain a curing accelerator. By using a combination of a curing agent and a curing accelerator, it is capable of more satisfactorily curing the epoxy resin. The type and the content of the curing accelerator are not particularly restricted, and an appropriate curing accelerator may be selected from the viewpoints of reaction speed, reaction temperature and storage property.

Specific examples of the curing accelerator include imidazole compounds, tertiary amine compounds, organic phosphine compounds, and complexes of an organic phosphine compound and an organic boron compound. Among these, from the viewpoint of heat resistance, the curing accelerator is preferably at least one selected from the group consisting of organic phosphine compounds and complexes of an organic phosphine compound and an organic boron compound.

Specific examples of the organic phosphine compounds include triphenyl phosphine, diphenyl(p-tolyl)phosphine, tris(alkylphenyl)phosphine, tris(alkoxyphenyl)phosphine, tris(alkylalkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phosphine, trialkyl phosphine, dialkylaryl phosphine, and alkyldiaryl phosphine.

Specific examples of the complexes of an organic phosphine compound and an organic boron compound include tetraphenyl phosphonium tetraphenyl borate, tetraphenyl phosphonium tetra-p-tolyl borate, tetrabutyl phosphonium tetraphenyl borate, tetraphenyl phosphonium n-butyltriphenyl borate, butyltriphenyl phosphonium tetraphenyl borate, and methyltributyl phosphonium tetraphenyl borate.

These curing accelerators may be used singly, or in combination of two or more kinds thereof.

In a case in which a combination of two or more curing accelerators is used, the mixing ratio thereof may be decided with no particular restriction in accordance with the properties desired for the resulting cured product (e.g., the degree of required flexibility).

In a case in which the resin composition contains a curing accelerator, a content of the curing accelerator in the resin composition is not particularly restricted. From the viewpoint of moldability, the content of the curing accelerator is preferably from 0.2% by mass to 3.0% by mass, more preferably from 0.3% by mass to 2.0% by mass, still more preferably from 0.4% by mass to 1.5% by mass, with respect to a total mass of the epoxy resin and the curing agent which is optionally used.

(Filler)

The epoxy resin composition may contain a filler. In a case in which the epoxy resin composition contains a filler, the heat conductivity of the obtainable cured product is improved. An epoxy resin having a mesogenic structure constructs a high order structure having a filler-centered high orderliness in a cured product, which tends to remarkably enhance the heat conductivity of the cured product (see, for example, International Publication No. WO 2013/065159). This is conceivably because the filler functions as an efficient heat conduction path in the cured product of an epoxy resin where a high order structure is constructed.

Whether or not a filler-centered high order structure is constructed in the cured product of the epoxy resin containing a filler may be judged by observing a cured product (thickness: about 1 mm) in a state sandwiched by the slide glasses with a polarizing microscope (for example, BX51 of Olympus Corporation). At this time, an interference pattern is observed around the filler in a region where the filler is present.

This observation is preferably performed not in a crossed Nicol state, but in a state where the analyzer is rotated by 60° with respect to the polarizer. When the cured product is observed in a crossed Nicol state, since the region where no interference pattern is observed (i.e., the region where a higher-order structure is not formed by the resin cured product) appears as a dark field, the region cannot be distinguished from the filler portions. However, the region where no interference pattern is observed does not appear as a dark field when the analyzer is rotated by 60° with respect to the polarizer, so that the region can be distinguished from the filler portions.

A content of the filler in an epoxy resin composition is not particularly limited. From the viewpoint of the moldability of an epoxy resin composition and the ease of handling of an epoxy resin sheet, the content of the filler with respect to a total solid content of the epoxy resin composition is preferably from 45% by volume to 90% by volume, and from the viewpoint of the heat conductivity of the cured product, more preferably from 45% by volume to 85% by volume. From the viewpoint of the thixotropy of the epoxy resin composition in a case in which the epoxy resin composition is prepared as a varnishy epoxy resin composition, it is further preferably from 50% by volume to 78% by volume.

A content, on a volume basis, of the filler with respect to the total solid content of the epoxy resin composition is measured as follows. First, a mass (Wc) of the epoxy resin composition at 25° C. is measured, and the epoxy resin composition is subjected to a heat treatment in air at 400° C. for 2 hours, and then at 700° C. for 3 hours to remove resin components by decomposing and burning, followed by measuring a mass (Wf) of the remaining filler at 25° C. Next, a specific gravity (df) of the filler at 25° C. is obtained using an electronic specific gravity meter or a pycnometer. Subsequently, a specific gravity (dc) of the epoxy resin composition at 25° C. is measured in the same manner. Thereafter, a volume (Vc) of the epoxy resin composition and a volume (Vf) of the remaining filler are obtained, and then the volume of the remaining filler is divided by the volume of the epoxy resin composition as shown in (Formula 1), to obtain a volume ratio (Vr) of the filler.

$$Vc = Wc/dc$$

$$Vf = Wf/df$$

$$Vr\ (\%) = (Vf/Vc) \times 100 \quad \text{(Formula 1)}$$

Vc: volume of epoxy resin composition (cm$^3$)
Wc: mass of epoxy resin composition (g)
dc: density of epoxy resin composition (g/cm$^3$)
Vf: volume of filler (cm$^3$)
Wf: mass of filler (g)
df: density of filler (g/cm$^3$)
Vr: volume ratio of filler There is no particular restriction on the mass-based content of the filler in an epoxy resin composition. The content of the filler is, for example, preferably from 1 part by mass to 99 parts by mass, more preferably 40 parts by mass to 95 parts by mass, and further preferably from 60 parts by mass to 90 parts by mass based on the total solid content of the epoxy resin composition as 100 parts by mass. In a case in which the content of the filler is within the above range, the heat conductivity of the cured product tends to be further enhanced.

There is no particular restriction on the kind of filler. Examples thereof include alumina, silica, magnesium oxide, aluminum nitride, boron nitride, and silicon nitride. The fillers may be used singly or in combination of two or more kinds thereof From the viewpoint of the heat conductivity of the cured product, as the filler a nitride such as boron nitride, silicon nitride, or aluminum nitride is preferable, and at least one of boron nitride and aluminum nitride is more preferable. From the viewpoint of electrical insulation, boron nitride is further preferable.

The kind of filler contained in an epoxy resin composition can be confirmed by, for example, an energy dispersive X-ray analysis (EDX).

The filler may have a particle size distribution having a single peak or may have a particle size distribution having two or more peaks. From the viewpoint of the filling rate of the filler in an epoxy resin composition, it exhibits preferably a particle size distribution having two or more peaks. The filler exhibiting a particle size distribution having two or more peaks may be obtained by combining two or more kinds of fillers having different particle sizes.

In a case in which the filler exhibits a particle size distribution having two or more peaks, it is preferable that the first peak is in a range of from 0.1 µm to 0.8 µm and the second peak is in a range of from 20 µm to 60 µm. In order to obtain a filler having such a particle size distribution, it is preferable to use the first filler having an average particle diameter of from 0.1 µm to 0.8 µm and the second filler having an average particle diameter of from 20 µm to 60 µm in combination.

In a case in which the filler exhibits a particle size distribution having two or more peaks, the filling rate of the filler is improved, and the heat conductivity of the cured product tends to be improved. From the viewpoint of the filling property of the filler, an average particle size of the second filler is preferably from 30 µm to 50 µm, and an average particle size of the first filler is preferably from $1/150$ to $1/8$ times the average particle size of the second filler.

In the present disclosure, the particle size distribution of a filler means a volume cumulative particle size distribution measured by laser diffractometry. Further, the average particle size of a filler means a particle size at which the volume cumulative particle size distribution measured by laser diffractometry reaches 50%. A measurement of a particle size distribution by laser diffractometry may be performed using a laser diffraction scattering particle size distribution analyzer (for example, LS13 (trade name) of Beckman Coulter, Inc.). A filler dispersion used for the measurement may be prepared, for example, by adding the filler to a 0.1% by mass aqueous solution of sodium metaphosphate, and ultrasonically dispersing it, and adjusting a concentration so that the light amount becomes appropriate in terms of the sensitivity of the analyzer.

In a case in which the filler contains the above-mentioned first filler and second filler, the second filler is preferably a nitride filler. In this case, the first filler may be a nitride filler or any of other fillers, and preferably at least one of alumina and aluminum nitride from the viewpoint of the heat conductivity of the cured product, or the thixotropy of a varnishy epoxy resin composition.

From the viewpoint of the heat conductivity of the cured product, adhesiveness and mechanical strength, the filler preferably contains alumina, and more preferably contains α-alumina. In a case in which alumina is contained as a filler, examples of alumina include γ-alumina, θ-alumina and δ-alumina, and it is preferable to contain only α-alumina from the viewpoint of the heat conductivity.

The shape of alumina as a filler is preferably particulate. The shape of alumina can be confirmed by a scanning electron microscope (SEM). The presence of α-alumina in alumina can be confirmed with an X-ray diffraction spectrum. Specifically, the presence of α-alumina can be confirmed using a peak peculiar to α-alumina as an indicator according to the description of Japanese Patent No. 3759208.

A content of α-alumina in alumina as a filler is preferably 80% by volume or more, more preferably 90% by volume or more, and further preferably 100% by volume with respect to a total volume of alumina from the viewpoint of heat conductivity and fluidity. As the α-alumina content becomes higher, formation of a high order structure by a mesogen-containing epoxy compound is more promoted, and the cured product superior in heat conductivity tends to be yielded. The content of α-alumina in alumina as a filler can be confirmed with an X-ray diffraction spectrum.

The α-alumina as a filler may have a single peak or a plurality of peaks when a particle size distribution curve is plotted with the particle size on the horizontal axis and the frequency on the vertical axis.

When the α-alumina as a filler has a single peak in the plotted particle size distribution curve, the average particle diameter (D50) that is a particle size at which the volume cumulated from the smaller particle size side reaches 50% in the volume cumulative particle size distribution of the α-alumina, is preferably from 0.1 µm to 50 µm, and more preferably from 0.1 µm to 30 µm.

In a case in which the filler contains boron nitride, the crystal form of boron nitride may be any of hexagonal, cubic, or rhombohedral, and preferably hexagonal because the particle size is easily regulated. Two or more kinds of boron nitride having different crystal forms may be used in combination.

In a case in which the filler contains boron nitride, it is preferable that the nitride filler has been subjected to grinding or aggregating from the viewpoint of the heat conductivity of the cured product, or the viscosity when a varnishy epoxy resin composition is used as an epoxy resin composition. Examples of the particle shape of the nitride filler include a circular, a spherical, and a scaly shape. Further the nitride filler may be aggregated particles obtained by aggregating these particles. From the viewpoint of enhancing the filling property of the nitride filler, the particle is preferably circular or spherical, which has a ratio of the major axis to the minor axis (aspect ratio) of 3 or less, more preferably circular or spherical, which has an aspect ratio of 2 or less, and further preferably spherical. In this regard, the aspect ratio of a particle means a value obtained by imaging the particles using an electron microscope or the like, measuring the major axis and the minor axis of each particle, and then calculating the arithmetic mean of the ratio of the major axis to the minor axis.

The major axis of a particle means herein the length of the circumscribed rectangle of the particle, and the minor axis of a particle means the width of the circumscribed rectangle of the particle. Further, a particle is spherical means that the aspect ratio is 1.5 or less.

As the nitride filler, hexagonal boron nitride particles having been subjected to aggregating are preferable. The aggregated hexagonal boron nitride particles have many spaces, and therefore the particles are easily collapsed and deformed by applying pressure to the particles. Therefore, even when the content of the filler is set low in order to reduce the viscosity of a varnishy epoxy resin composition, the substantial filler content can be increased by compressing the epoxy resin composition with a press or the like. From the viewpoint of easiness of forming heat conduction paths by means of contacts between fillers having high heat conductivity, it might seem that a circular or scaly particle shape of fillers is more preferable than a spherical shape because there can be more contact points. However spherical particles are more preferable from the viewpoint of the filling property of fillers, and the balance between the thixotropy and the viscosity of an epoxy resin composition.

There is no particular restriction on a volume average particle diameter (D50) of a nitride filler. From the viewpoint of the moldability of an epoxy resin composition, it is preferably 100 μm or less, and from the viewpoint of the heat conductivity of the cured product and the thixotropy of a varnishy epoxy resin composition, it is more preferably from 20 μm to 100 μm and from the viewpoint of electrical insulation of the cured product, it is further preferably from 20 μm to 60 μm.

There is no particular restriction on the proportion of a nitride filler in the filler. In one mode, from the viewpoint of the electrical insulation of the cured product, it is preferably from 10% by volume to 100% by volume of the entire filler. From the viewpoint of the thixotropy of a varnishy epoxy resin composition, it is more preferably from 20% by volume to 98% by volume, and from the viewpoint of the heat conductivity of the cured product, further preferably from 30% by volume to 95% by volume.

In addition, in another mode, the proportion of a nitride filler in the filler is preferably from 50% by volume to 98% by volume of the entire filler. From the viewpoint of the filling property, it is more preferably from 60% by volume to 95% by volume, and from the viewpoint of the heat conductivity of the cured product, further preferably from 65% by volume to 95% by volume.

(Silane Coupling Agent)

An epoxy resin composition may contain a silane coupling agent. In a case in which an epoxy resin composition contains a silane coupling agent, the heat conductivity and the insulation reliability of the cured product tend to be further improved. This is conceivably because a silane coupling agent performs the functions of forming covalent bonds between the surface of the filler and the resins surrounding the same (corresponding to a binder), to enhance the heat conductivity, and improve the insulation reliability by preventing penetration of water.

A silane coupling agent may be present in a state covering the surface of the filler contained in an epoxy resin composition, or may be present in a portion other than the surface of the filler.

There is no particular restriction on the kind of silane coupling agent, and a commercially available one may be used. Considering the compatibility between a resin and a curing agent, and reduction of the heat conductivity defect at the interface between a resin and a filler, it is preferable in the present disclosure to use a silane coupling agent having an epoxy group, an amino group, a mercapto group, a ureido group or a hydroxyl group at the terminal.

Specific examples of the silane coupling agent include 3-glycidoxypropyltrimethoxysilane, 3-glycidoxypropyltriethoxysilane, 3-glycidoxypropylmethyldiethoxysilane, 3-glycidoxypropylmethyldimethoxysilane, 2-(3,4-epoxycyclohexyl)ethyltrimethoxysilane, 3-aminopropyltriethoxysilane, 3-(2-aminoethyl)aminopropyltrimethoxysilane, 3-(2-aminoethyl)aminopropyltriethoxysilane, 3-aminopropyltrimethoxysilane, N-phenyl-3-aminopropyltrimethoxysilane, 3-mercaptopropyltrimethoxysilane, 3-mercaptopropyltriethoxysilane, and 3-ureidopropyltriethoxysilane, as well as silane coupling agent oligomers represented by SC-6000KS2 (trade name, available from Hitachi Chemical Techno Service Co., Ltd.). These silane coupling agents may be used singly, or in combination of two or more kinds thereof.

In a case in which the resin composition contains the silane coupling agent, a content of the silane coupling agent in the epoxy resin composition is not particularly limited. The content of the silane coupling agent is preferably from 0.01% by mass to 0.2% by mass, and more preferably from 0.03% by mass to 0.1% by mass, with respect to a total mass of the resin and the curing agent which is optionally used.

(Solvent)

There is no particular restriction on the solvent, insofar as it does not impede the curing reaction of an epoxy resin composition, and an organic solvent used commonly may be appropriately selected and used.

<Resin Sheet>

A resin sheet in the present disclosure has a resin composition layer including the epoxy resin composition in the present disclosure. The resin composition layer may be constituted with one layer or two or more layers. The resin sheet in the present disclosure may further include, if necessary, a release film.

The resin sheet may be produced, for example, by applying a varnishy epoxy resin composition prepared by adding an organic solvent, such as methyl ethyl ketone or cyclohexanone, to an epoxy resin composition (hereinafter also referred to as "resin varnish") to a release film such as a PET film, and drying the same.

A resin varnish can be applied by a publicly known method. Specific examples thereof include comma coating, die coating, lip coating, and gravure coating. As a method for applying a resin varnish for forming a resin composition layer with a predetermined thickness, a comma coating method of transporting an object to be coated thorough a gap, or a die coating method of applying a resin varnish through a nozzle at a regulated flow rate is used. For example, in a case in which a thickness of a resin composition layer before drying is to be set from 50 μm to 500 μm, it is preferable to use the comma coating method.

There is no particular restriction on the drying method, insofar as at least part of an organic solvent contained in the resin varnish can be removed, and an appropriate one out of commonly used drying methods may be selected.

The resin sheet preferably has the first resin composition layer containing an epoxy resin composition, and the second resin composition layer containing an epoxy resin composition layered on or above the first resin composition layer. For example, the resin sheet is preferably a layered body of the first resin composition layer formed with an epoxy resin composition, and the second resin composition layer formed with an epoxy resin composition. By this structure, the dielectric voltage can be improved. The epoxy resin compositions forming the first resin composition layer and the second resin composition layer may have the same composition, or different compositions. The epoxy resin compositions forming the first resin composition layer and the second resin composition layer preferably have the same composition from the viewpoint of heat conductivity.

In a case in which the resin sheet is a layered body, it is preferably produced by stacking the first resin composition layer and the second resin composition layer, which is formed with epoxy resin compositions. With such a constitution, the dielectric voltage tends to be improved.

For example, this can be understood as follows. That is, by stacking the two resin composition layers, a thin portion (pinhole or void) that may exist in one resin composition layer may be compensated with the other resin composition layer. Conceivably for this reason, the minimum insulation thickness can be increased, so that the dielectric voltage is improved. The occurrence probability of a pinhole or void in the resin sheet producing method is not high, and the probability of overlap of thin portions when two resin composition layers are combined is a square value of such low probability, namely the number of pinholes or voids approaches zero. Since dielectric breakdown occurs at the weakest point in terms of insulation, it can be considered that the effect of improving the dielectric voltage can be obtained by combining two resin composition layers. Further, it can be considered that by combining two resin composition layers, the probability of a contact between the fillers is increased, and the effect of improving the heat conductivity can be also obtained.

The method of producing a resin sheet preferably includes: obtaining a layered body by stacking the second resin composition layer formed with an epoxy resin composition on the first resin composition layer formed with an epoxy resin composition; and heating and pressing the obtained layered body. According to such a producing method, the dielectric voltage tends to be improved.

There is no particular restriction on a density of a resin sheet, and it is usually from 3.0 g/cm$^3$ to 3.4 g/cm$^3$. Considering the balance between flexibility and heat conductivity, the density of a resin sheet is preferably from 3.0 g/cm$^3$ to 3.3 g/cm$^3$, and more preferably from 3.1 g/cm$^3$ to 3.3 g/cm$^3$. The density of a resin sheet can be adjusted by, for example, the blending amount of an inorganic filler.

In a case where a resin sheet has two or more resin composition layers, in the present disclosure, the density of a resin sheet means the average value of the densities of all the resin composition layers. In addition, in a case where a resin sheet includes a release film, the density means the density of the resin composition layer excluding the release film.

There is no particular restriction on a thickness of a resin sheet, and it may be appropriately selected according to the purpose. For example, the thickness of a resin sheet may be set at from 10 μm to 350 μm, and from the viewpoint of heat conductivity, suppression of detachment due to thermal stress, electrical insulation and sheet flexibility, preferably from 50 μm to 300 μm.

In the resin sheet, a curing reaction has not progressed substantially. As a result, it has favorable flexibility, however its bendability is poor. Therefore, in a state where a support (application object) such as a PET film is removed, the self-standing property of the sheet is poor, and handling of the same may be sometimes difficult. Therefore, it is preferable that the resin sheet is further heat-treated until the resin composition constituting the same reaches a semi-cured state.

Here, the resin sheet obtained by drying a resin composition is also referred to as an A-stage sheet. A semi-cured resin sheet obtained by further heat-treating the A-stage sheet is also referred to as a B-stage sheet, and a cured sheet obtained by further heat-treating the A-stage sheet or the B-stage sheet is also referred to as a C-stage sheet. The terms of A-stage, B-stage, and C-stage shall be referred to JIS K6900:1994.

<B-Stage Sheet>

A B-stage sheet in the present disclosure has a semi-cured resin composition layer including a semi-cured product of the epoxy resin composition in the present disclosure.

A B-stage sheet can be produced, for example, by a producing method including heat-treating a resin sheet to a B-stage.

When it is formed by heat-treating a resin sheet, the heat conductivity can be superior, detachment due to thermal stress can be suppressed, and the flexibility and the working life as a B-stage sheet can be superior.

The exhibition that a B-stage sheet is a semi-cured product means that it is in a state where a resin composition layer has a viscosity of from $10^4$ Pa·s to $10^5$ Pa·s at room temperature (25° C.), and from $10^2$ Pa·s to $10^3$ Pa·s at 100° C. The viscosity is measured by a dynamic viscoelasticity measurement (frequency: 1 Hz, load: 40 g, and temperature increase rate: 3° C./min).

There is no particular restriction on the conditions for heat-treating a resin sheet, insofar as the resin composition layer can be semi-cured to the B stage, and they can be appropriately selected according to the composition of the epoxy resin composition. For such a heat treatment, a heat treatment method selected from hot vacuum pressing, hot roll laminating, or the like is preferable for the purpose of eliminating voids in a resin composition layer generated when the epoxy resin composition is applied. By doing so, a smoother B-stage sheet can be efficiently produced.

Specifically, for example, by heating and pressurizing a resin composition layer under a reduced pressure (for example, 1 MPa) at a temperature of from 50° C. to 180° C., and at a press pressure of from 1 MPa to 30 MPa, for 1 sec to 3 min, it can be semi-cured to the B stage.

The thickness of the B-stage sheet may be appropriately selected according to the purpose. For example, it can be from 10 μm to 350 μm, and from the viewpoint of heat conductivity, suppression of detachment due to thermal stress, electrical insulation, or flexibility, it is preferably from 50 μm to 300 μm. Further, a B-stage sheet can be produced by stacking two or more resin sheets and simultaneously hot-pressing the same.

<C-Stage Sheet>

A C-stage sheet in the present disclosure has a cured resin composition layer including a cured product of the epoxy resin composition in the present disclosure.

The C-stage sheet can be produced by, for example, a producing method including heat-treating the resin sheet or the B-stage sheet to a C stage.

There is no particular restriction on the conditions for heat-treating the resin sheet or the B-stage sheet, insofar as the resin composition layer or the semi-cured resin composition layer can be cured to the C stage, and they may be appropriately selected corresponding to the composition of the epoxy resin composition. From the viewpoint of suppressing generation of voids in a C-stage sheet, and improving the withstand voltage of a C-stage sheet, the heat treatment is preferably performed by a heat treatment method such as hot vacuum pressing. By this process, a smoother C-stage sheet can be produced efficiently.

Specifically, for example, a resin composition layer or a semi-cured resin composition layer may be cured to the C stage by a hot pressing treatment at a heating temperature of from 100° C. to 250° C., at from 1 MPa to 20 MPa for 1 min to 30 min. The heating temperature is preferably from 130° C. to 230° C., and more preferably from 150° C. to 220° C.

A thickness of the C-stage sheet may be appropriately selected corresponding to the purpose, and may be, for example, 50 μm to 350 μm, and preferably from 60 μm to 300 μm from the viewpoint of heat conductivity, suppression of detachment due to thermal stress, electrical insulation, and flexibility of the sheet. Meanwhile, by hot-pressing two or more layers of resin sheets or B-stage sheets in a stacked state, a C-stage sheet can be also produced.

A C-stage sheet preferably has a storage elastic modulus at 25° C. determined by a tensile test in a dynamic viscoelasticity measurement according to JIS K 7244-1:1998 is preferably 10 GPa or less, and more preferably 7 GPa or less.

The storage elastic modulus of a C-stage sheet is measured by cutting a 200 μm-thick C-stage sheet into a 30 mm×5 mm rectangle, and then using a dynamic viscoelasticity instrument (for example, RSA III manufactured by TA Instruments) in a tensile mode under the conditions of grip distance: 20 mm, frequency: 10 Hz, measurement temperature range: 20° C. to 300° C., temperature increase rate: 5° C./min, and temperature: 25° C.

<Cured Product>

A cured product in the present disclosure is a cured product of the epoxy resin composition in the present disclosure. There is no particular restriction on the method of curing an epoxy resin composition, and a commonly used method can be appropriately selected. For example, a cured product of the epoxy resin composition can be obtained by heat-treating an epoxy resin composition.

There is no particular restriction on the method of heat-treating an epoxy resin composition, or on the heating conditions. The temperature range of the heat treatment can be appropriately selected according to the kinds of an epoxy resin and a curing agent that constitute the epoxy resin composition. There is no particular restriction on the heat treatment time either, and it may be appropriately selected corresponding to the shape, thickness, etc. of a cured product.

The cured product preferably has a storage elastic modulus at 25° C. determined by a tensile test in a dynamic viscoelasticity measurement according to JIS K 7244-1:1998 is preferably 10 GPa or less, and more preferably 7 GPa or less.

The storage elastic modulus of a cured product is measured by cutting a 200 μm-thick C-stage sheet into a 30 mm×5 mm rectangle, and then using a dynamic viscoelasticity instrument (for example, RSA III manufactured by TA Instruments) in a tensile mode under the conditions of grip distance: 20 mm, frequency: 10 Hz, measurement temperature range: 20° C. to 300° C., temperature increase rate: 5° C/min, and temperature: 25° C.

<Metal Foil with Resin>

A metal foil with resin in the present disclosure has: a metal foil; and a semi-cured resin composition layer that is provided on or above the metal foil, and that includes a semi-cured product of the epoxy resin composition in the present disclosure. When a semi-cured resin composition layer including a semi-cured product of the epoxy resin composition in the present disclosure is provided, the metal foil with resin in the present disclosure is superior in heat conductivity, and detachment due to thermal stress is suppressed.

The semi-cured resin composition layer is obtained by heat-treating an epoxy resin composition so as to be the B-stage.

Examples of a metal foil include a gold foil, a copper foil, and an aluminum foil, and generally a copper foil is used.

A thickness of a metal foil is, for example, from 1 μm to 35 μm, and is preferably from 20 μm or less from the viewpoint of flexibility.

Examples of a metal foil further include a composite foil with a three-layer structure, in which on both sides of an intermediate layer of nickel, a nickel-phosphorus alloy, a nickel-tin alloy, a nickel-iron alloy, lead, a lead-tin alloy or the like, copper layers are provided; and a composite foil with a two-layer structure, in which an aluminum layer and a copper layer are combined. In the case of a composite foil with a three-layer structure in which copper layers are provided on both the sides of the intermediate layer, it is preferable that one copper layer has a thickness of from 0.5 μm to 15 μm, and the other copper layer has a thickness of from 10 μm to 300 μm.

A metal foil with resin may be produced, for example, by forming a resin composition layer (resin sheet) by applying an epoxy resin composition (preferably a resin varnish) onto a metal foil and drying it, and then heat-treating the same so that the resin composition layer is brought into the B stage. The method of forming the resin composition layer is as described above.

There is no particular restriction on the conditions for producing a metal foil with resin. It is preferable that 80% by mass or more of the organic solvent used for the resin varnish has been vaporized in the resin composition layer after drying. There is no particular restriction on the drying temperature, and about 80° C. to 180° C. is preferable. The drying time may be appropriately selected in consideration of the gelation time of the resin varnish. The applied amount of the resin varnish is preferably selected such that the thickness of the resin composition layer after drying is from 50 μm to 350 μm, and more preferably from 60 μm to 300 μm.

The resin composition layer after drying is brought into the B stage by an additional heat treatment. The conditions for heat-treating the resin composition layer are the same as those for the B-stage sheet.

<Metal Substrate>

A metal substrate in the present disclosure has: a metal support; a cured resin composition layer that is provided on or above the metal support, and that includes a cured product of the epoxy resin composition in the present disclosure; and a metal foil that is provided on or above the cured resin composition layer.

When a cured resin composition layer including a cured product of the epoxy resin composition in the present disclosure is placed between the metal support and the metal foil, the heat conductivity is improved, and detachment due to thermal stress is suppressed.

The material, thickness, etc. of a metal support can be appropriately selected according to the purpose. Specifically, the thickness can be set at from 0.5 mm to 5 mm using a metal such as aluminum or iron.

As the metal foil in a metal substrate, the same metal foil as described in connection with the metal foil with resin can be used, and the same applies to a preferred mode.

A metal substrate in the present disclosure can be produced, for example, as follows.

A metal substrate may be produced by the procedures, in which an epoxy resin composition is applied on to a metal support and dried it to form a resin composition layer, and then a metal foil is placed on the resin composition layer, and subjected to a heat treatment and a pressure treatment to cure the resin composition layer. As a method of applying the resin composition layer on a metal support and drying it, the same method as described in connection with the metal foil with resin can be used.

Alternatively, a metal substrate may be produced by the procedures, in which a metal foil with resin is bonded onto a metal support such that the semi-cured product of the resin composition layer faces the metal support, and subjected to a heat treatment and a pressure treatment to cure the semi-cured product of the resin composition layer.

<Power Semiconductor Device>

A power semiconductor device has: a semiconductor module including a metal plate, a solder layer and semiconductor chip in this order; a heat dissipator; and a cured resin composition layer that is provided between the metal plate and the heat dissipator, and that includes a cured product of the epoxy resin composition in the present disclosure.

In the power semiconductor device, only the semiconductor module portion may be sealed with a sealing material, or the entire power semiconductor module may be encapsulated with a mold resin or the like. An example of the power semiconductor device will be described below with reference to the drawings.

FIG. 1 is a schematic sectional view illustrating an example of the configuration of a power semiconductor device. In FIG. 1, the cured product 102 of the epoxy resin composition is placed between the heat dissipation base substrate 104 and the metal plate 106 in a semiconductor module which has the metal plate 106, the solder layer 110 and the semiconductor chip 108 in this order. The semiconductor module portion is sealed with the sealing material 114.

Figure 2:
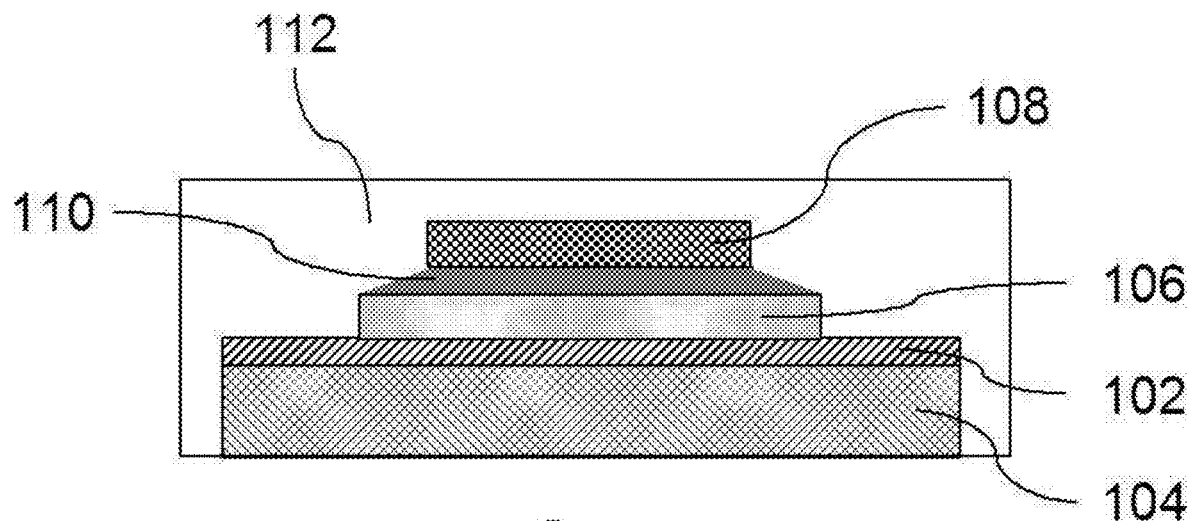
FIG. 2 is a schematic sectional view illustrating an example of configuration of a power semiconductor device in the present disclosure.

FIG. 2 is a schematic sectional view illustrating another example of the configuration of a power semiconductor device. In FIG. 2, the cured product 102 of the epoxy resin composition is placed between the heat dissipation base substrate 104 and the metal plate 106 in a semiconductor module which has the metal plate 106, the solder layer 110, and the semiconductor chip 108 in this order. The semiconductor module and the heat dissipation base substrate 104 are encapsulated with the mold resin 112.

As described above, the cured product of an epoxy resin composition in the present disclosure may be used as a heat dissipation adhesive layer between the semiconductor module and the heat dissipation base substrate as shown in FIG. 1. Further, in a case where the entire power semiconductor device is encapsulated as shown in FIG. 2, it can be used as a heat dissipation material between the heat dissipation base substrate and the metal plate.

EXAMPLES

The present embodiments will be described in more details below by way of Examples, provided that the present invention be not restricted in any way by the following Examples.

The materials used for preparing an epoxy resin composition, and their abbreviations are shown below.

(Epoxy Resin)

Epoxy resin 1: A reaction product [charged equivalent ratio: mesogen-containing epoxy compound 1/X-22-1876=10/2.5] between 4-{4-(2,3-epoxypropoxy)phenyl}cyclohexyl=4-(2,3 -epoxypropoxy)benzoate [mesogen-containing epoxy compound 1; epoxy equivalent: 212 g/eq, produced by the method according to JP-A No. 2011-74366; the following chemical formula], and the siloxane resin having a hydroxyl group at the terminal [trade name X-22-1876 from Shin-Etsu Chemical Co., Ltd.; hydroxyl equivalent: 487, and weight average molecular weight: 700].

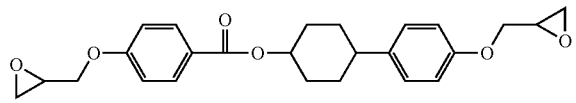

Epoxy resin 2: A reaction product between a biphenyl epoxy compound [mesogen-containing epoxy compound 2, trade name YL6121H from Mitsubishi Chemical Corporation], and a siloxane compound having a hydroxyl group at the terminal [trade name X-22-1876 from Shin-Etsu Chemical Co., Ltd.].

Epoxy resin 3: A reaction product [charged equivalent ratio: mesogen-containing epoxy compound 3/X-22-1876=10/2.5] between 1-{(3-methyl-4-oxiranylmethoxy)phenyl }-4-4-(4-oxiranylmethoxyphenyl)-1-cyclohexene (mesogen-containing epoxy compound 3, the following chemical formula; epoxy equivalent: 201 g/eq), and a siloxane compound having a hydroxyl group at the terminal [X-22-1876].

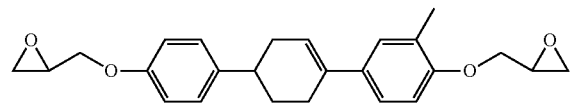 [SMILES: Cc1cc(C2=CCC(c3ccc(OCC4CO4)cc3)CC2)ccc1OCC1CO1]

Epoxy resin 4: A reaction product [charged equivalent ratio: mesogen-containing epoxy compound 4/X-22-1876=10/2.5] between 4-{4-(2,3-epoxypropoxy)phenyl}cyclohexyl=4-(2,3-epoxypropoxy)-3-methylbenzoate [mesogen-containing epoxy compound 4; epoxy equivalent: 219 g/eq, produced by the method according to JP-A No. 2011-74366; the following chemical formula], and the siloxane compound having a hydroxyl group at the terminal [X-22-1876].

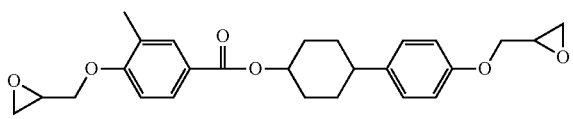

Epoxy resin 5: A reaction product [charged equivalent ratio: mesogen-containing epoxy compound 5/X-22-1876=10/2.5] between 2-methyl-1,4-phenylene-bis{4-(2,3-epoxypropoxy)benzoate} [mesogen-containing epoxy compound 5; epoxy equivalent: 238, produced by the method according to JP-A No. 2011-241797; the following chemical formula], and the siloxane compound having a hydroxyl group at the terminal [X-22-1876].

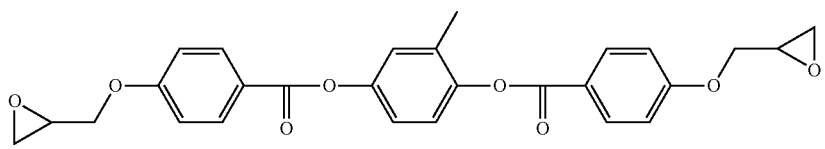 [SMILES: Cc1cc(OC(=O)c2ccc(OCC3CO3)cc2)ccc1OC(=O)c1ccc(OCC2CO2)cc1]

Epoxy resin 6: A reaction product [charged equivalent ratio: mesogen-containing epoxy compound 1/KF105=10/2.5] between the mesogen-containing epoxy compound 1 and the siloxane resin having an amino group at the terminal [trade name KF-8010 from Shin-Etsu Chemical Co., Ltd.; amine equivalent: 430 g/eq, weight average molecular weight: 830].

Epoxy resin 7: A reaction product [charged equivalent ratio: mesogen-containing epoxy compound 1/X-22-162AS=10/2.5] between the mesogen-containing epoxy compound 1 and the siloxane compound having a carboxyl group at the terminal [trade name X-22-162AS from Shin-Etsu Chemical Co., Ltd.; carboxy equivalent: 420 g/eq, weight average molecular weight: 800].

Epoxy resin 8: A reaction product [charged equivalent ratio: mesogen-containing epoxy compound 1/X-22-1875=10:2.5] between the mesogen-containing epoxy compound 1 and the siloxane compound having a hydroxyl group at the terminal [trade name X-22-1875 from Shin-Etsu Chemical Co., Ltd.; hydroxyl equivalent: 965 g/eq, weight average molecular weight: 1500]

Epoxy resin 9: A reaction product [charged equivalent ratio: mesogen-containing epoxy compound 1/X-22-1876=10/7.5] between the mesogen-containing epoxy compound 1 and the siloxane compound having a hydroxyl group at the terminal [X-22-1876].

<Synthesis Example 1>

Into a 0.5 L-volume a reaction vessel, which is equipped with a thermometer, a stirrer, and a reflux condenser, and can be heated and cooled, 33.0 g of the siloxane compound (X-22-1876) having a hydroxyl group at the terminal, 60.0 g of the mesogen-containing epoxy compound 1, and 93.0 g of cyclohexanone were charged.

Then, the temperature was raised to 120° C. with stirring, and after confirming that the resin solid content was dissolved to form a uniform solution, 10 g of a 10% cyclohexanone solution of TPP was added, and the reaction was carried out at about 130° C. for 5 hours. Then, the solution was cooled down to room temperature (25° C.) to obtain the solution of the epoxy resin 1.

For the thus obtained epoxy resin 1, the weight-average molecular weight (Mw) was determined as follows.

The measurement of the Mw was performed using a high-performance liquid chromatography apparatus (trade name: L6000, available from Hitachi, Ltd.) and a data analyzer (trade name: C-R4A, available from Shimadzu Corporation). As analytical GPC columns, G2000HXL, G3000HXL and G4000HR (trade names) available from Tosoh Corporation were used. The measurement was performed at a sample concentration of 5 mg/cm$^3$ using tetrahydrofuran as a mobile phase at a flow rate of 1.0 mL /min. A calibration curve was prepared using a polystyrene standard sample, and the Mw were determined in terms of polystyrene using the calibration curve.

As a result of the measurement, the weight-average molecular weight (Mw) of the epoxy resin 1 was 1,700.

For the obtained Epoxy Resins 1, an epoxy equivalent was measured by perchloric acid titration. An epoxy equivalent of Epoxy Resins 1 was 460.

<Synthesis of Epoxy Resins 2 to 9>

An Epoxy Resins 2 to 9 were synthesized by the same manner as described in Synthesis Example 1, except that the mesogen-containing epoxy compound and the reactive siloxane compound were changed as shown in the following Table 1. A weight-average molecular weight (Mw) and an epoxy equivalent of Epoxy Resins 2 to 9 were measured by the same manner as described in Synthesis Example 1.

TABLE 1

| | Epoxy compound | Siloxane compound | Equivalent ratio Epoxy compound:Siloxane compound | weight-average molecular weight (Mw) | Epoxy equivalent (g/eq) |
|---|---|---|---|---|---|
| Epoxy resin 1 | Mesogen-containing epoxy compound 1 | Hydroxyl group at the terminal X-22-1876 | 10:2.5 | 1700 | 460 |
| Epoxy resin 2 | Mesogen-containing epoxy compound 2 YL6121H | Hydroxyl group at the terminal X-22-1876 | 10:2.5 | 1200 | 360 |
| Epoxy resin 3 | Mesogen-containing epoxy compound 3 | Hydroxyl group at the terminal X-22-1876 | 10:2.5 | 1500 | 420 |
| Epoxy resin 4 | Mesogen-containing epoxy compound 4 | Hydroxyl group at the terminal X-22-1876 | 10:2.5 | 1600 | 440 |
| Epoxy resin 5 | Mesogen-containing epoxy compound 5 | Hydroxyl group at the terminal | 10:2.5 | 1800 | 470 |

TABLE 1-continued

|  | Epoxy compound | Siloxane compound | Equivalent ratio Epoxy compound:Siloxane compound | weight-average molecular weight (Mw) | Epoxy equivalent (g/eq) |
|---|---|---|---|---|---|
|  | epoxy compound 5 | X-22-1876 |  |  |  |
| Epoxy resin 6 | Mesogen-containing epoxy compound 1 | Amino group at the terminal KF-8010 | 10:2.5 | 2100 | 530 |
| Epoxy resin 7 | Mesogen-containing epoxy compound 1 | Carboxyl group at the terminal X-22-162AS | 10:2.5 | 1900 | 470 |
| Epoxy resin 8 | Mesogen-containing epoxy compound 1 | Hydroxyl group at the terminal X-22-1875 | 10:2.5 | 2500 | 610 |
| Epoxy resin 9 | Mesogen-containing epoxy compound 1 | Hydroxyl group at the terminal X-22-1876 | 10:7.5 | 4700 | 840 |

(Filler)

AA-04 [alumina particle, available from Sumitomo Chemical Co., Ltd., D50: 0.40 μm]

HP-40 [boron nitride particle, available from Mizushima Ferroalloy Co., Ltd., D50: 40 μm]

(Curing Agent)

MEHC-7403H [high heat resistance and flame retardation phenolic resin, MEIWA PLASTIC INDUSTRIES, LTD, hydroxyl equivalent: 136 g/eq]

CRN [catechol resorcinol novolac (added ratio based on mass: catechol/resorcinol=5/95) resin, containing 50% by mass of cyclohexanone]

<CRN Synthesis Method>

To a 3-L separable flask equipped with a stirrer, a condenser and a thermometer, 627 g of resorcinol, 33 g of catechol, 316.2 g of a 37%-by-mass aqueous formaldehyde solution, 15 g of oxalic acid and 300 g of water were added, and the flask was heated in an oil bath to 100° C. The added materials were allowed to continuously react for 4 hours under reflux at a temperature of about 104° C. Then, the temperature inside the flask was raised to 170° C. while removing water by distillation. The reaction was allowed to further proceed for 8 hours with the temperature being maintained at 170° C. Thereafter, the resultant was concentrated for 20 min under reduced pressure to remove water and the like from the system, thereby obtaining a desired phenol novolac resin CRN.

The structure of the thus obtained CRN was checked by FD-MS (field-desorption ionization mass spectrometry), and the presence of all of partial structures represented by Formulae (III-1) to (III-4) was confirmed.

Under the above-described reaction conditions, it is believed that a compound having a partial structure represented by Formula (III-1) is generated first and this compound undergoes a dehydration reaction to yield compounds having a partial structure represented by at least one of Formulae (III-2) to (III-4).

For the thus obtained CRN, a number-average molecular weight (Mn) and also a weight-average molecular weight (Mw) were measured by the same manner of the number-average molecular weight (Mn) described in connection with the epoxy resin.

For the thus obtained CRN, the hydroxyl equivalent was also determined as follows.

The hydroxyl equivalent was measured by an acetyl chloride-potassium hydroxide titration method. Since the solution had a dark color, the titration end-point was judged not by a coloration method based on an indicator but by potentiometric titration. Specifically, the hydroxyl equivalent was determined by converting the hydroxyl groups of the resin to be measured into acetyl chloride in a pyridine solution, decomposing excess reagent with water, and then titrating the thus generated acetic acid with a potassium hydroxide/methanol solution.

The CRN obtained above was a novolac resin containing 35% by mass of a monomer component (resorcinol) as a low-molecular-weight diluent, and having hydroxyl equivalent: 62 g/eq, number-average molecular weight: 422, and weight-average molecular weight: 564

(Curing Accelerator)

TPP: triphenyl phosphine [available from Wako Chemical Industries, Ltd., trade name]

(Additive)

KBM-573: N-phenyl-3-aminopropyltrimethoxysilane [silane coupling agent, available from Shin-Etsu Chemical Co., Ltd., trade name]

(Solvent)

CHN: cyclohexanone (Support)

PET film [available from DuPont Teijin Films, Ltd., trade name: A53, thickness: 50 μm]

Copper foil [available from Furukawa Electric Co., Ltd., thickness: 105 μm, GTS grade]

<Example 1>

(Preparation of Resin Composition)

A varnishy epoxy resin composition was prepared by mixing 31.86% by mass of the epoxy resin 1 containing 50% by mass of cyclohexanone, 3.79% by mass of MEHC-7403H and 0.84% by mass of CRN as curing agents, 0.16% by mass of TPP as a curing accelerator, 43.99% by mass of HP-40 and 5.44% by mass of AA-04 as fillers, 0.05% by mass of KBM-573 as an additive, and 13.87% by mass of CHN as a solvent.

Assuming that the density of boron nitride (HP-40) was 2.20 g/cm$^3$, the density of alumina (AA-04) was 3.98 g/cm$^3$ and the density of a mixture of the epoxy resin 1 and the curing agent (CRN) was 1.20 g/cm$^3$, the proportion of the fillers with respect to the total volume of all solids of the epoxy resin composition was calculated to be 56% by volume.

<Preparation of B-Stage Sheet>

The varnishy epoxy resin composition was applied onto a PET film using an applicator and then dried at 120° C. for 10 min. Thereafter, hot pressing was performed with a vacuum press (press temperature: 80° C., degree of vacuum: 1 kPa, press pressure: 10 MPa, press time: 3 min) to obtain a B-stage sheet.

<Preparation of Copper Foil-Attached Cured Product of Epoxy Resin Composition>

After peeling off the PET film from the B-stage sheet obtained above, the sheet was sandwiched with two copper foils such that the matte side of each copper foil faced the semi-cured resin composition layer. Then the stack was vacuum hot pressed with a vacuum press (press temperature: 150° C., degree of vacuum: 1 kPa, press pressure: 5 MPa, press time: 30 min). Thereafter, heating was performed under atmospheric pressure, at 150° C. for 2 hours, and at 210° C. for 4 hours to yield a copper foil-attached cured product of the epoxy resin composition.

<Evaluation>
(Confirmation of High Order Structure (Liquid Crystal Phase))

While heating up the synthesized epoxy resin 1 at 10° C./min, the state change was observed with a polarizing microscope (product name "BS51", Olympus Corporation) at a magnification of 100×. In a case in which it was confirmed by observation in a crossed-Nicols state, that the epoxy resin had fluidity, and that there was a temperature range where transmitted light due to depolarization was recognized with the naked eye, it was judged as a liquid crystal phase.

In this regard, a state having fluidity is defined as a state where a body left standing causes plastic deformation due to its own weight or an equivalent external stress. Further, a state where transmitted light due to depolarization is recognized with the naked eye means a state where a majority of ordinary persons skilled in the art can recognize with the naked eye a change in a dark field portion in a crossed-Nicols state and a portion causing depolarization.

(Measurement of Heat Conductivity)

The copper of the copper foil-attached cured product of epoxy resin composition obtained above was removed by etching to obtain the cured product of a sheet-shaped epoxy resin composition (C-stage sheet). The thickness of the obtained C-stage sheet was measured at 9 positions using a micrometer (micrometer IP65, Mitutoyo Corporation), and the arithmetic mean value thereof was calculated to find 200 μm.

The obtained C-stage sheet was cut into a 10 mm square, and used as a sample. After blackening the sample with graphite spraying, the thermal diffusivity was measured by a xenon flash method (trade name: LFA447 NANOFLASH, from NETZSCH-Geraetebau GmbH). Based on this value, and the product of a density measured by the Archimedes method and a specific heat measured by a DSC (differential scanning calorimeter; trade name: DSC PYRIS 1 from Perkin Elmer), the heat conductivity of the C-stage sheet in the thickness direction was determined.

(Measurement of Dynamic Viscoelasticity)

The dynamic viscoelasticity was measured by cutting the obtained C-stage sheet into a 30 mm×5 mm rectangle, and then using a dynamic viscoelasticity instrument (RSA III manufactured by TA Instruments) in a tensile mode under the conditions of grip distance: 20 mm, frequency: 10 Hz, measurement temperature range: 20° C. to 300° C., temperature increase rate: 5° C./min, and temperature: 25° C. according to JIS K 7244-1:1998.

<Examples 2 to 9>

Epoxy resin compositions 2 to 9 were prepared in the same manner as in Example 1 except that the epoxy resin 1 was replaced with the epoxy resins 2 to 9 respectively, and each addition amount of the curing agent was changed such that the ratio of the number of equivalents of the epoxy groups in the epoxy resin to the number of equivalents of the hydroxyl groups in the curing agent (number of equivalents of epoxy groups/number of equivalents of hydroxyl groups) ran to 1:1.

The cured products (C-stage sheet) of the sheet-shaped epoxy resin compositions were prepared in the same manner as in Example 1 except that the epoxy resin composition 1 was replaced with the epoxy resin compositions 2 to 9 respectively, and evaluated in the same manner as above. The results are shown in Table 2.

<Comparative Example 1>

An epoxy resin composition C1 was prepared in the same manner as in Example 1 except that the epoxy resin 1 was replaced with the mesogen-containing epoxy compound 1, and the addition amount of the curing agent was changed such that the ratio of the number of equivalents of the epoxy groups in the epoxy resin to the number of equivalents of the hydroxyl groups in the curing agent (number of equivalents of epoxy groups/number of equivalents of hydroxyl groups) ran to 1:1.

The comparative C-stage sheet was prepared in the same manner as in Example 1 except that the epoxy resin composition 1 was replaced with the epoxy resin composition C1 prepared above, and evaluated in the same manner as above. The results are shown in Table 2.

<Comparative Example 2>

An epoxy resin composition C2 was prepared in the same manner as in Example 1 except that the epoxy resin 1 was replaced with the epoxy compound having no mesogenic structure (multifunctional epoxy resin, trade name 1032-H60 from Mitsubishi Chemical Corporation, epoxy equivalent: 170 g/eq), and the addition amount of the curing agent was changed such that the ratio of the number of equivalents of the epoxy groups in the epoxy resin to the number of equivalents of the hydroxyl groups in the curing agent (number of equivalents of epoxy groups/number of equivalents of hydroxyl groups) ran to 1:1.

The comparative C-stage sheet was prepared in the same manner as in Example 1 except that the epoxy resin composition 1 was replaced with the epoxy resin composition C2 prepared above, and evaluated in the same manner as above. The results are shown in Table 2.

TABLE 2

| | Presence or Absence of High order structure (Liquid crystal phase) | Heat conductivity (W/(m · K)) | Elastic modulus (GPa) |
| --- | --- | --- | --- |
| Example 1 | Presence | 10.1 | 6.5 |
| Example 2 | Presence | 8.9 | 6.3 |
| Example 3 | Presence | 9.2 | 5.8 |
| Example 4 | Presence | 9.3 | 6.2 |
| Example 5 | Presence | 9.4 | 6.0 |
| Example 6 | Presence | 10.2 | 6.9 |
| Example 7 | Presence | 10.1 | 6.7 |
| Example 8 | Presence | 9.4 | 4.9 |
| Example 9 | Presence | 9.0 | 4.1 |
| Comparative Example 1 | Presence | 10.8 | 10.2 |
| Comparative Example 2 | Absence | 8.5 | 12.5 |

As shown in Table 2, Comparative Example 1 using an epoxy resin having a mesogenic structure but not a siloxane structure was superior in heat conductivity to Comparative Example 2 using an epoxy resin having neither mesogenic structure nor siloxane structure.

However, Comparative Example 1 exhibited a higher elastic modulus than Examples 1 to 9 using an epoxy resin having a mesogenic structure and a siloxane structure.

In Examples 1 to 9 using an epoxy resin having a mesogenic structure and a siloxane structure, a heat conductivity, which was comparable to that of Comparative Example 1 using an epoxy resin having a mesogenic structure but not a siloxane structure, was exhibited.

Explanation of Reference Numerals

102: Cured product of epoxy resin composition, 104: Heat dissipation base substrate, 106: Metal plate, 108: Semiconductor chip; 110: Solder layer, 112: Mold resin, 114: Sealing material

The invention claimed is:

1. An epoxy resin composition, comprising:
an epoxy resin comprising a mesogenic structure and a siloxane structure, wherein the mesogenic structure comprises a structure represented by the following Formula (1):

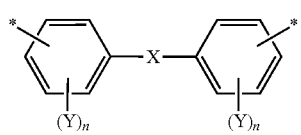

wherein, in Formula (1), X represents a single bond or at least one kind of linking group selected from the following Group (I) consisting of divalent groups; each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group; each n independently represents an integer from 0 to 4; and * is a linking portion in a molecule;

Group (I) consisting of divalent groups

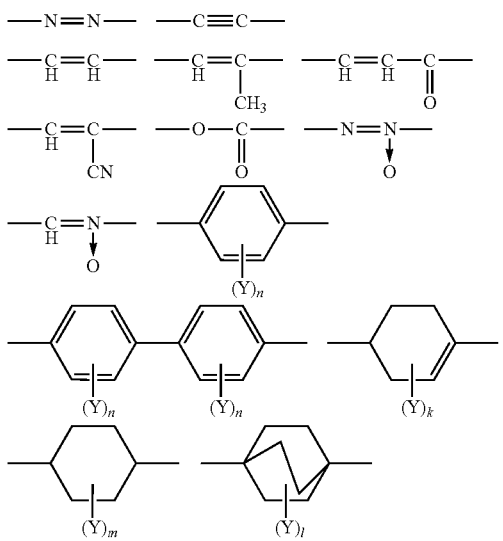

wherein, in Group (I) consisting of divalent groups, each Y independently represents an aliphatic hydrocarbon group having from 1 to 8 carbon atoms, an aliphatic alkoxy group having from 1 to 8 carbon atoms, a fluorine atom, a chlorine atom, a bromine atom, an iodine atom, a cyano group, a nitro group, or an acetyl group; each n independently represents an integer from 0 to 4; k represents an integer from 0 to 7; m represents an integer from 0 to 8; and l represents an integer from 0 to 12, and wherein an epoxy equivalent of the epoxy resin is from 250 g/eq to 2000 g/eq; and
a curing agent comprising a novolac resin including a partial structure represented by at least one selected from the group consisting of the following Formulas (III-1), (III-2), (III-3), and (III-4),

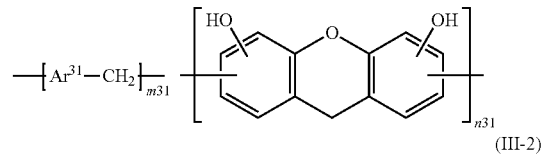

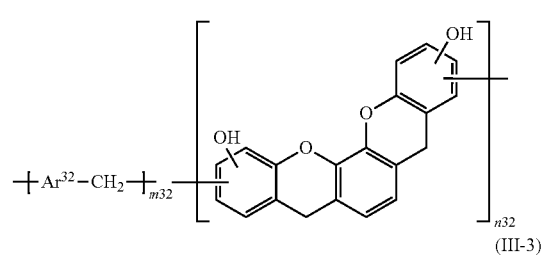

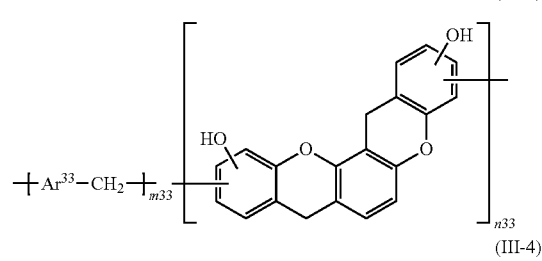

wherein in Formulas (III-1), (III-2), (III-3), and (III-4), each of m31, m32, m33, m34, n31, n32, n33, and n34 independently represents a positive integer, each of $Ar^{31}$, $Ar^{32}$, $Ar^{33}$, and $Ar^{34}$ independently represents a group represented by the following Formulas (III-a) or (III-b),

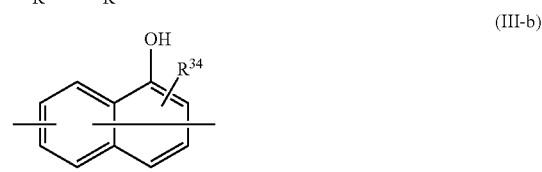

wherein in Formulas (III-a) and (III-b), each of $R^{31}$ and $R^{34}$ independently represents a hydrogen atom or a hydroxyl group; and each of $R^{32}$ and $R^{33}$ independently represents a hydrogen atom, or an alkyl group having 1 to 8 carbon atoms.

2. The epoxy resin composition according to claim 1, further comprising a filler.

3. The epoxy resin composition according to claim 2, wherein a content of the filler is from 45% by volume to 90% by volume, with respect to the total volume of all solids of the epoxy resin composition.

4. The epoxy resin composition according to claim 1, wherein the epoxy resin composition is capable of forming a high order structure.

5. A resin sheet, comprising a resin composition layer comprising the epoxy resin composition according to claim 1.

6. A B-stage sheet, comprising a semi-cured resin composition layer comprising a semi-cured product of the epoxy resin composition according to claim 1.

7. The B-stage sheet according to claim 6, wherein the semi-cured resin composition layer comprises a high order structure.

8. A C-stage sheet, comprising a cured resin composition layer comprising a cured product of the epoxy resin composition according to claim 1.

9. The C-stage sheet according to claim 8, wherein the cured resin composition layer comprises a high order structure.

10. A cured product of the epoxy resin composition according to claim 1.

11. The cured product according to claim 10, wherein the cured product comprises a high order structure.

12. A metal foil with resin, comprising:
a metal foil; and
a semi-cured resin composition layer that is provided on or above the metal foil, and that comprises a semi-cured product of the epoxy resin composition according to claim 1.

13. A metal substrate, comprising:
a metal support;
a cured resin composition layer that is provided on or above the metal support, and that comprises a cured product of the epoxy resin composition according to claim 1; and
a metal foil that is provided on or above the cured resin composition layer.

14. A power semiconductor device, comprising:
a semiconductor module comprising a metal plate, a solder layer and a semiconductor chip in this order;
a heat dissipator; and
a cured resin composition layer that is provided between the metal plate and the heat dissipator, and that comprises a cured product of the epoxy resin composition according to claim 1.

* * * * *